US006788744B1

(12) United States Patent
Hirama

(10) Patent No.: US 6,788,744 B1
(45) Date of Patent: Sep. 7, 2004

(54) POWER CONTROL CIRCUIT AND TRANSMITTER

(75) Inventor: Atsuhiro Hirama, Sendai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/474,168

(22) Filed: Dec. 29, 1999

(30) Foreign Application Priority Data

Mar. 17, 1999 (JP) .......................................... 11-071774

(51) Int. Cl.⁷ ............................................ H04L 25/49
(52) U.S. Cl. .................... 375/297; 375/146; 455/127.3
(58) Field of Search ................................ 375/297, 146, 375/140, 141, 285, 295, 296; 455/114.3, 127.1, 127.2, 127.3

(56) References Cited

U.S. PATENT DOCUMENTS

| 4,553,105 A | | 11/1985 | Sasaki |
| 5,457,811 A | * | 10/1995 | Lemson ...................... 455/67.1 |
| 6,272,125 B1 | * | 8/2001 | Nomura ...................... 370/342 |

FOREIGN PATENT DOCUMENTS

| EP | 0 171 524 A2 | 2/1986 |
| EP | 0 887 925 A2 | 12/1998 |
| EP | 0 907 239 A1 | 4/1999 |
| JP | 8-102768 | 4/1996 |
| JP | 8-307182 | 11/1996 |
| JP | 10-93450 | 4/1998 |

* cited by examiner

*Primary Examiner*—Young T. Tse
*Assistant Examiner*—David B. Lugo
(74) *Attorney, Agent, or Firm*—Katten Muchin Zavis Rosenman

(57) ABSTRACT

In a power control circuit according to the present invention, a circuit for making a desired response at a specific level is stationarily fed with a signal at the specific level so that the resultant level deviation is automatically corrected at a stage subsequent to the circuit. Besides, a transmitter according to the present invention is configured with provided a modulator as the above-described circuit. In a system or equipment according to those inventions, without its configuration being changed drastically, the desired characteristics and performances are kept with high accuracy, the cost for the manufacture, maintenance, and running is reduced, and the overall reliability is improved.

10 Claims, 17 Drawing Sheets

FIG. 16
PRIOR ART
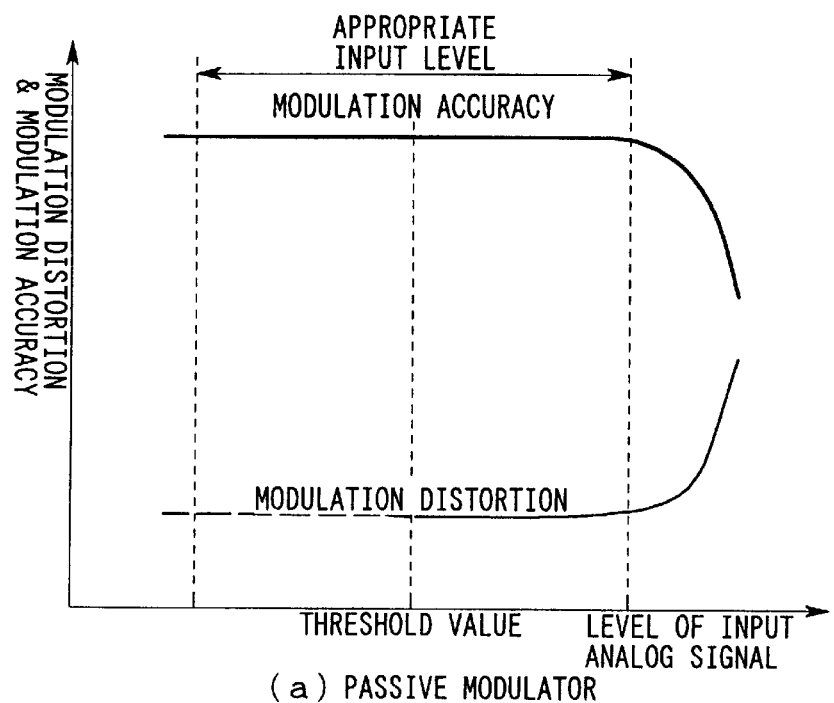
(a) PASSIVE MODULATOR
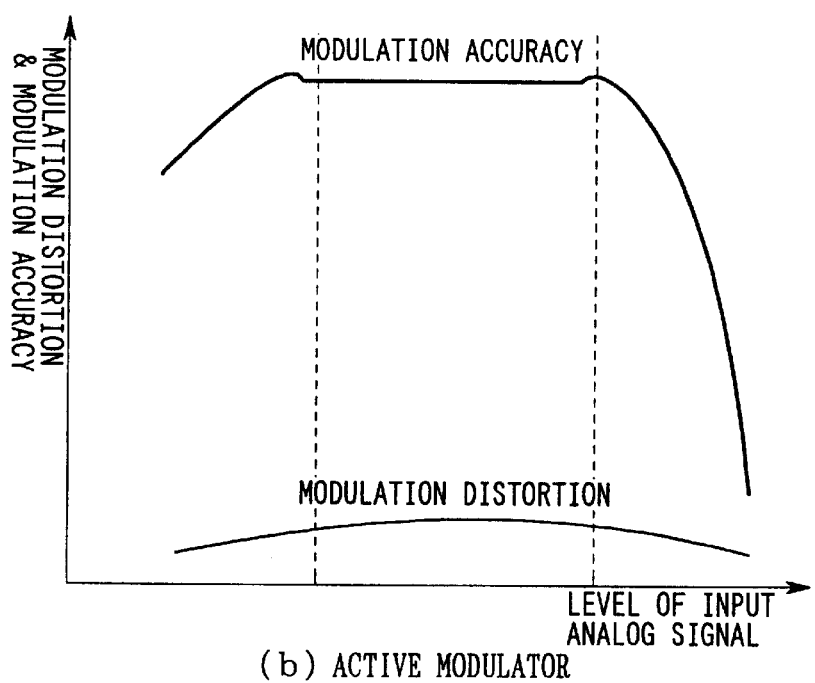
(b) ACTIVE MODULATOR

FIG. 17
PRIOR ART
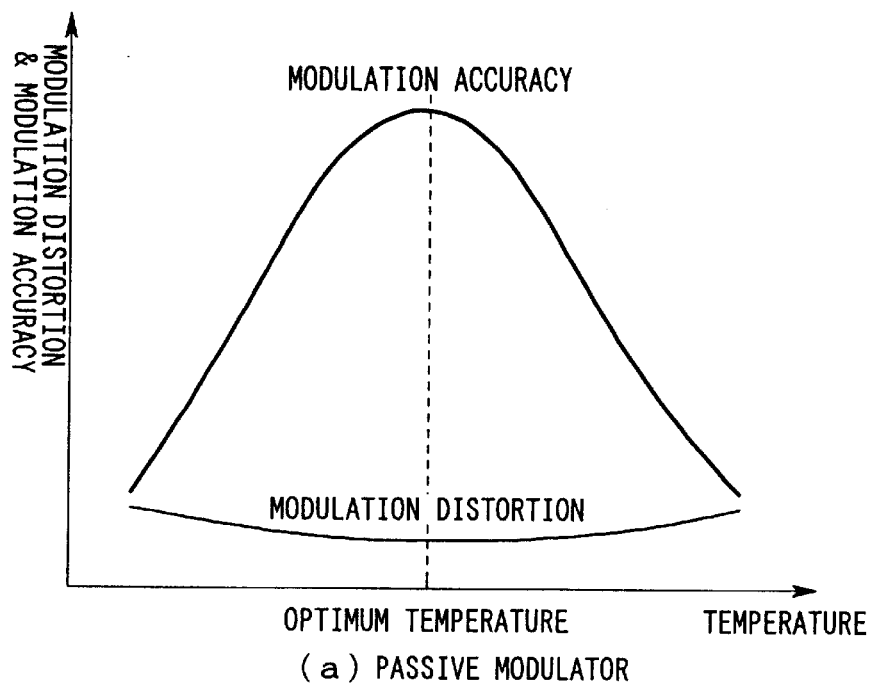
(a) PASSIVE MODULATOR
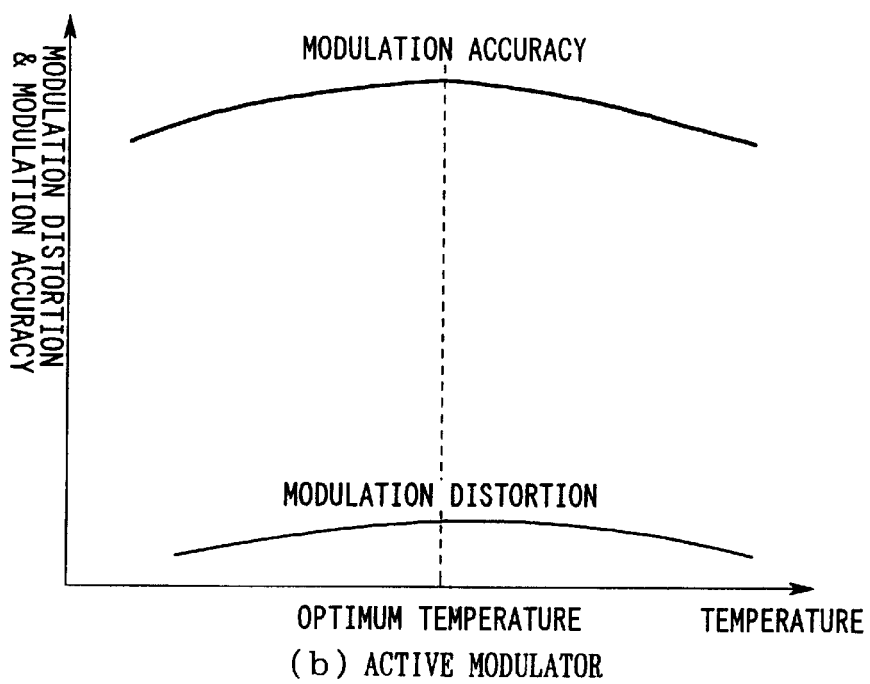
(b) ACTIVE MODULATOR

POWER CONTROL CIRCUIT AND TRANSMITTER

BACKGROUND OF THE INVENTION

1. Field of the Invention

The present invention relates, in an electronic equipment on which is mounted a circuit capable of acquiring desired characteristics for a specific level of an input signal, to a power control circuit for maintaining the level of a signal outputted by a subsequent stage of the circuit, at a specific value, and to a transmitter having the power control circuit mounted thereon.

2. Description of the Related Art

The CDMA (Code Division Multiple Access) system is being applied to various communication systems because it intrinsically has confidentiality and interference-resistivity and is a multiple access system capable of making effective use of radio frequencies.

On the other hand, the CDMA system is being positively applied in recent years to a mobile communication system because it is able to solve the near-far problem by establishing the technique for realizing the transmitting power control of high responsiveness and accuracy.

FIG. 14 is a block diagram showing an example of the configuration of a transmission part of a radio base station of a mobile communication system to which the CDMA system is applied.

In FIG. 14, a plurality N of power controlling parts 91-1 to 91-N are fed at their individual base band inputs with different base band signals 1 to N, and their outputs are connected with corresponding inputs of a multiplexing part 92. The output of the multiplexing part 92 is connected with a feeding point of an antenna 98 through a D/A converter 93, a modulator 94, a multiplier 95, a variable gain amplifier 96 and an amplifier 97, which are connected in tandem. The output of an oscillator 99 is connected with a carrier input of the modulator 94, and the output of an oscillator 100 is connected with a spreading code input of the multiplier 95. Control terminals of the power controlling parts 91-1 to 91-N and the variable gain amplifier 96 are connected with the corresponding input/output ports of a controlling part 101.

In the transmission part of the configuration, the controlling part 101 forms a wireless zone and a radio channel appropriate for the CDMA system between itself and a mobile station located in the wireless zone, by associating itself with the not-shown receiving part on the basis of a predetermined channel setting procedure. Moreover, the controlling part 101 watches the transmission qualities of the individual radio channels thus formed, by associating itself with the above-described receiving part.

On the other hand, the controlling part 101 varies the gain (FIG. 15(1)) to a value appropriate for the watching result, for such ones of the power controlling parts 91-1 to 91-N as correspond to the individual radio channels of the watching result, to absorb the difference in the transmission loss for each radio channel, as caused by the difference in the relative distances between the individual mobile stations located in the above-described wireless zones and the radio base station and by the change in the distances.

Here, the processing to vary the gain in the base band regions of the power controlling parts 91-1 to 91-N, as described above, will be simply called the "transmitting power control".

The multiplexing part 92 thus multiplexes the base band signals, having the level set in the base band regions by the power controlling parts 91-1 to 91-N operating under the controlling part 101, to generate a digital signal indicating the sum of the signals to be transmitted to the above-described plurality of radio channels in the digital region.

The D/A converter 93 converts the digital signal into an analog signal. The modulator 94 generates a primary modulated wave by modulating the carrier signal generated by the oscillator 99, according to the analog signal.

Here, it is assumed for simplicity that the modulation made by the modulator 94 corresponds to a primary modulation appropriate for the direct sequence type of the CDMA system.

The multiplier 95 generates the transmission wave by performing a secondary modulation to multiply the spreading code generated by the oscillator 100 and the above-described primary modulated wave.

The variable gain amplifier 96 performs power amplification (FIG. 15(2)) together with the amplifier 97 to feed the above-described transmission wave to the feeding point of the antenna 98. Here, the gain of the variable gain amplifier 96 is adjusted to a constant value at which the level of the transmission wave takes a predetermined value in the course of the running and maintaining routines.

By sharing the variable gain amplifier 96 and the amplifier 97 for the transmissions of the plurality of radio channels, therefore, the hardware of the radio base station is scaled down, and the level of the transmission wave to be transmitted through the antenna 98 is kept for each channel at the level of eliminating or easing the "deterioration in the transmission quality caused by a drastic change or difference of the location of the individual mobile stations located in the wireless zone formed by the radio base station" (as will be shortly called the "near-far problem").

Here in this example of the prior art, in order to solve the near-far problem, the transmitting power control generally has to be made over a dynamic range wider by 40 decibels to 60 decibels than that of the transmitting part appropriate for the TDMA system or the FDMA system.

In order to achieve the desired characteristics for the analog signal fed under the power control made over such wide dynamic range, therefore, not an active modulator to which an active element is applied but a passive modulator composed of only passive element(s) has/have to be applied as the modulator 94.

However, the passive modulator has a wider dynamic range than that of the active modulator (FIG. 16(b)), as shown in FIG. 16(a), but it is constructed mostly of discrete parts so that it has a large physical size.

Of the circuits constructing the passive modulator, moreover, a phase shift circuit for converting the carrier signal generated by the oscillator 99 into two carrier signals crossing each other has a far higher changing rate of phase shift with respect to the temperature than that of an equivalent circuit belonging to the active modulator.

In the example of the prior art, therefore, a temperature compensating circuit for compensating the fluctuation of the phase shift with respect to the temperature has to be mounted together with the modulator 94.

Here, the active modulator has a far lower changing rate of characteristics with respect to the temperature than that of the passive modulator, as illustrated in FIGS. 17(a) and (b), so it can be applied when a desired dynamic range is achieved.

However, the active modulator is unable to realize the above-described wide dynamic range due to the characteristics of the active elements to be applied and by the restrictions on the power supply voltage, so that it is practically hard to apply and cannot always realize an integrated circuit.

On the other hand, with the above-described desired dynamic range wider, the level of the analog signal to be actually inputted to the modulator 94 has a higher possibility of exceeding the range of the appropriate input level at which the upper limit and the lower limit are given, for example, by two thin dotted lines as illustrated in FIG. 15, and at which the above-described desired characteristics are kept.

SUMMARY OF THE INVENTION

An object of the invention is to provide a power control circuit and a transmitter having performances maintained stable over a wide dynamic range without any drastic changes in the configuration.

Another object of the invention is to keep the desired characteristics and performances maintained even if the level of an input signal may fluctuate.

Still another object of the invention is to avoid the degradation of performances due to the fluctuation or deviation of the characteristics of components.

A further object of the invention is to obtain a signal of a satisfactory SN ratio and a desired level at an output terminal and stably maintain the level of reliability and performance irrespective of the level of the input signal.

A further object of the invention is to ease the restrictions on the packaging and component orientation.

A further object of the invention is to reduce the manufacturing, maintenance and running cost and to enhance the overall reliability without drastically complicating the configuration or enlarging the scale of the hardware.

The above-specified objects are achieved by a power control circuit comprising: measuring means for measuring the level Li of an input signal; level variant means for amplifying the input signal with a first gain G1 and feeding it to a circuit for making a desired response when fed with a signal at a predetermined level Ls; level adjustment means for amplifying an output signal obtained as a response of the circuit, with a second gain G2; and controlling means for setting the first gain G1 to a ratio between the predetermined level Ls and the level Li measured by the measuring means and setting the second gain G2 to a ratio between a level Lt of an output signal to be obtained at the output terminal of the level adjustment means and a product of the predetermined level Ls and a gain g of the circuit in a condition for making the desired response.

In this power control circuit, at the individual stages from the input terminal of the level variant means through the circuit to the output terminal of the level adjustment means, the level diagram is distributed while maintaining the condition for meeting the requirement for the circuit to make the desired response, and the output signal at the desired level Lt is obtained at the output terminal of the level adjustment means even if the level of the input signal fluctuates.

Therefore, even if there is a wide range for the level of the input signal to fluctuate, the desired characteristics and performances are maintained at a highly accurate level.

On the other hand, the above-described objects are achieved by a power control circuit comprising: measuring means for measuring a level Li of a specific input signal to meet the requirement for a circuit making a desired response to make the desired response, among a plurality N of input signals fed in parallel when fed with a signal at a specific level Ls; combining means for combining the plurality of input signals to generate a single input signal; level variant means for amplifying the single input signal which is generated by the combining means and is to be fed to the circuit, at a stage prior or subsequent to the combining means with a first gain G1; level adjustment means for amplifying an output signal, obtained as a response of the circuit, with a second gain G2; and controlling means for setting the first gain G1 to a ratio between the specific level Ls and the level Li measured by the measuring means and setting the second gain G2 to a ratio between a level Lt of an output signal to be obtained at the output terminal of the level adjustment means and a product of the specific level Ls and a gain g of the circuit in a condition for the desired response.

In this power control circuit, at the individual stages from the input terminal of the combining means through the level variant means and the circuit to the output terminal of the level adjustment means, the level diagram is distributed while maintaining the condition for meeting the requirement for the circuit to make the desired response, and the output signal at the desired level Lt is obtained at the output terminal of the level adjustment means even if the level of the input signal fluctuates.

Therefore, even if there is a range for the level of the input signal to fluctuate, the desired characteristics and performances are maintained at a highly accurate level.

On the other hand, the above-described objects are achieved by a transmitter comprising: measuring means for measuring the level Li of an input signal; level variant means for amplifying the input signal with a first gain G1; a modulator for generating a modulated wave by modulating a carrier signal in accordance with an input signal fed through the level variant means, the modulator having a desired characteristic when fed with a signal at a predetermined level Ls; level adjustment means for generating a transmission wave to be sent to a transmission channel by amplifying the modulated wave generated by the modulator, with a second gain G2; and controlling means for setting the first gain G1 to a ratio between the predetermined level Ls and the level Li measured by the measuring means and setting the second gain G2 to a ratio between a level Lt of a transmission wave to be obtained at the output terminal of the level adjustment means and a product of the predetermined level Ls and a gain g of the modulator in a condition for the making desired response.

In this transmitter, at the individual stages from the input terminal of the level variant means through the modulator to the output terminal of the level adjustment means, the level diagram is distributed while maintaining the condition for meeting the requirement for the modulator to make the desired response, and the output signal at the desired level Lt is obtained at the output terminal of the level adjustment means even if the level of the input signal fluctuates.

Therefore, even if there is a range for the level of the input signal to fluctuate, the desired characteristics and performances are maintained at a highly accurate level.

Moreover, the above-described objects are achieved by a transmitter comprising: combining means for combining a plurality of input signals fed in parallel and generating a single input signal; a modulator for generating a modulated wave by modulating a carrier signal in accordance with a single input signal inputted, the modulator having a desired characteristic when the level of the single input signal is at a predetermined level Ls; level variant means for amplifying the single input signal to be fed to the modulator through the combining means, at a stage prior or subsequent to the combining means with a first gain G1; measuring means for measuring the level of the plurality N of input signals; level adjustment means for generating a transmission wave to be sent out to a transmission channel by amplifying the modulated wave generated by the modulator, with a second gain G2; and controlling means for reducing the first gain G1 of the level variant means and enlarging the second gain G2 of the level adjustment means, when the level of at least one input signals exceeds a threshold value in the measuring means.

In this transmitter, at the individual stages from the input terminal of the combining means through the level variant means and the modulator to the output terminal of the level adjustment means, the level diagram kept in a condition that the degradation of the characteristics of the modulator is reduced or suppressed due to the rise in the level of the input signal.

Therefore, even when the level of the input signal rises, the desired characteristics and performances are maintained at a highly accurate level.

Moreover, the above-described objects are achieved by a power control circuit, in which the difference in the response time between the prior stage and the subsequent stage of the circuit is suppressed, and a transmitter provided with a modulator as the circuit.

In the control circuit and transmitter, the excess and deficiency of the gain are avoided, as could otherwise transiently occur at the above-described prior and/or subsequent stages.

On the other hand, the above-described objects are achieved by a power control circuit for making a feed-back control to maintain the level of the signal obtained at the output terminal of the subsequent stage of the circuit, at a desired value, and a transmitter provided with a modulator as the circuit.

In the power control circuit and transmitter, the degradation in the performance are avoided due to the fluctuation of characteristics and the deviation of the circuit and the prior stage of the circuit.

Moreover, the above-described objects are achieved by a power control circuit for keeping the gain of the prior stage of the circuit at the value for the maximum SN ratio of an output signal obtained at the output terminal of the circuit, and a transmitter provided with a modulator as the circuit.

In these power control circuit and transmitter, the level of the reliability and performance are maintained stable irrespective of the number of input signals fed in parallel with the circuit and the level of the input signals.

On the other hand, the above-described objects are achieved by a power control circuit, in which the gain of a subsequent stage of the circuit is fed as instantaneous values of multiple-valued analog signals to the subsequent stage and to which the gains fed as the instantaneous values are held and applied cyclically in the order of time series, and a transmitter provided with a modulator as the circuit.

In the power control circuit and transmitter, with the number of gains expressed as the multiple-values larger, the desired number of signal lines is reduced, and the restrictions on the packaging and component orientation are eased.

Moreover, the above-described objects are achieved by a power control circuit, in which the gain of the prior stage of the circuit is varied on the basis of the hysteresis appropriate for the history of the level of the signal actually inputted, and a transmitter provided with a modulator as the circuit.

In the power control circuit and transmitter, even if the level of the input signal fed to the prior stage of the circuit frequently fluctuates, the level of the input signal fed to the circuit is maintained at a highly accurate and stable level at the value for the circuit to make a predetermined response, so that the performance is maintained stable.

Here, further objects and features of the present invention will be clarified by the following detailed description to be made with reference to the accompanying drawings.

BRIEF DESCRIPTION OF THE DRAWINGS

FIG. 16 presents charts illustrating changes in the characteristics of modulators against an input level; and FIG. 17 presents charts illustrating changes in the characteristics of modulators against a temperature.

DESCRIPTION OF THE PREFERRED EMBODIMENTS

First of all, the principle of a power control circuit and a transmitter according to the invention will be described here.

Figure 1:
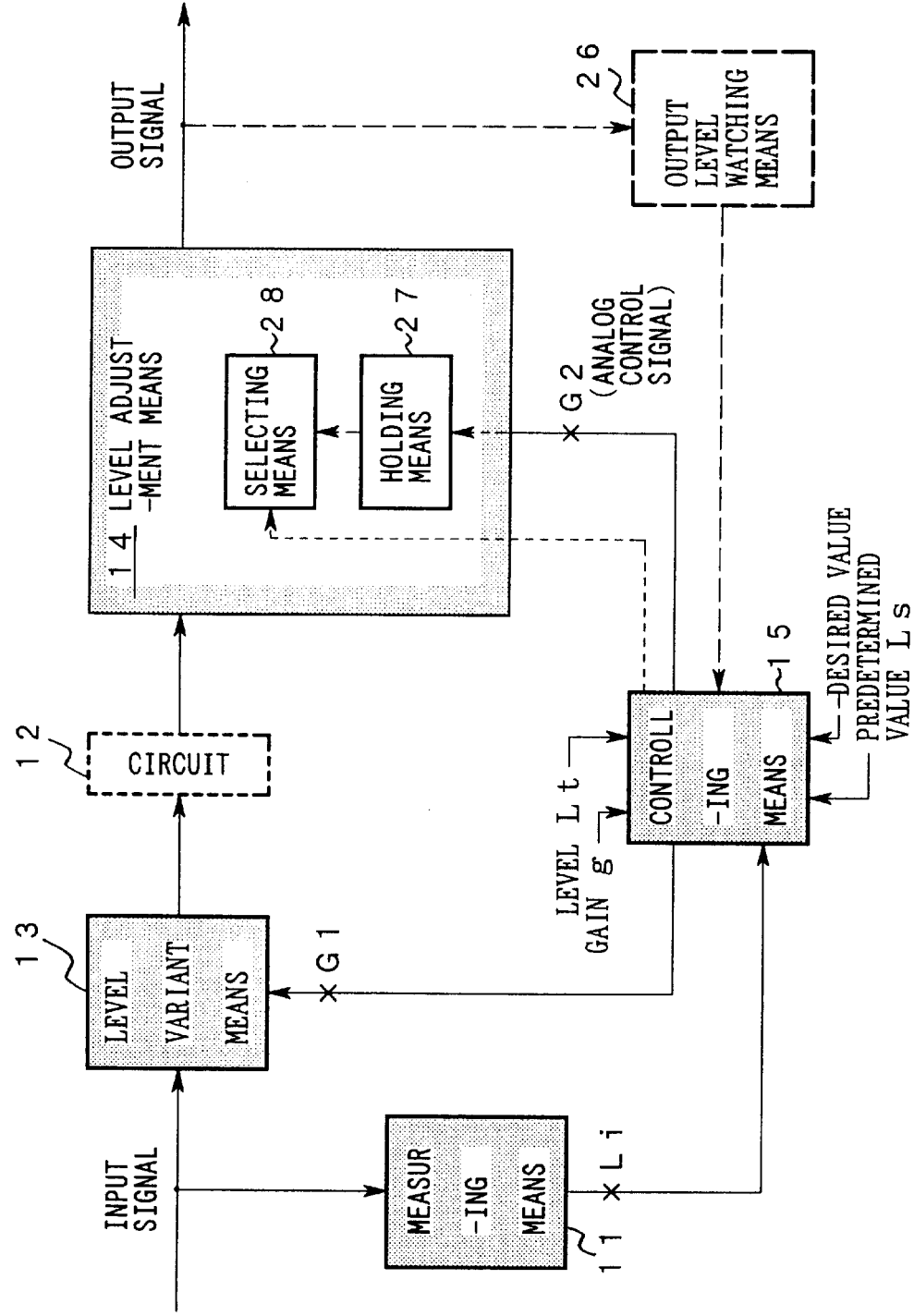
FIG. 1 is a block diagram showing a principle of a power control circuit according to the present invention.

FIG. 1 is a block diagram showing the principle of the power control circuit according to the present invention.

The first power control circuit according to the invention comprises: measuring means 11 for measuring the level Li of an input signal; level variant means 13 for amplifying the input signal with a first gain G1 and feeding it to a circuit 12 for making a desired response when fed with a signal at a predetermined level Ls; level adjustment means 14 for amplifying an output signal, as obtained as the response of the circuit 12, with a second gain G2; and controlling means 15 for setting the first gain G1 to a ratio between the specific level Ls and the level Li measured by the measuring means 11 and for setting the second gain G2 to a ratio between a level Lt of an output signal to be obtained at the output terminal of the level adjustment means 14 and the product of the predetermined level Ls and a gain g of the circuit 12 in a condition for making the desired response.

The principle of the first power control circuit according to the invention is as follows.

The circuit 12 makes the desired response when fed with the signal at the predetermined level Ls. The level variant means 13 amplifies the input signal with the first gain G1 and feeds the amplified signal to the circuit 12. The measuring means 11 measures the level Li of the input signal, and the level adjustment means 14 amplifies the output signal obtained as the response of the circuit 12 with the second gain G2.

On the other hand, the controlling means 15 sets the first gain G1 to the ratio between the above-described predetermined level Ls and the level Li measured by the measuring means 11. Moreover, the controlling means 15 sets the second gain G2 to the ratio between the level Lt of the output signal to be obtained at the output terminal of the level adjustment means 14, and the product of the predetermined level Ls and the gain g of the circuit 12 in a condition for making the above-described desired response.

Specifically, at the individual stages from the input terminal of the level variant means 13 through the circuit 12 to the output terminal of the level adjustment means 14, the level diagram is distributed while maintaining the condition for meeting the requirement for the circuit 12 to make the desired response, and the output signal at the desired level Lt is obtained at the output terminal of the level adjustment means 14 even if the level of the input signal fluctuates.

Therefore, even if there is a wide range for the level of the input signal to fluctuate, the desired characteristics and performances are maintained at a highly accurate level.

Figure 2:
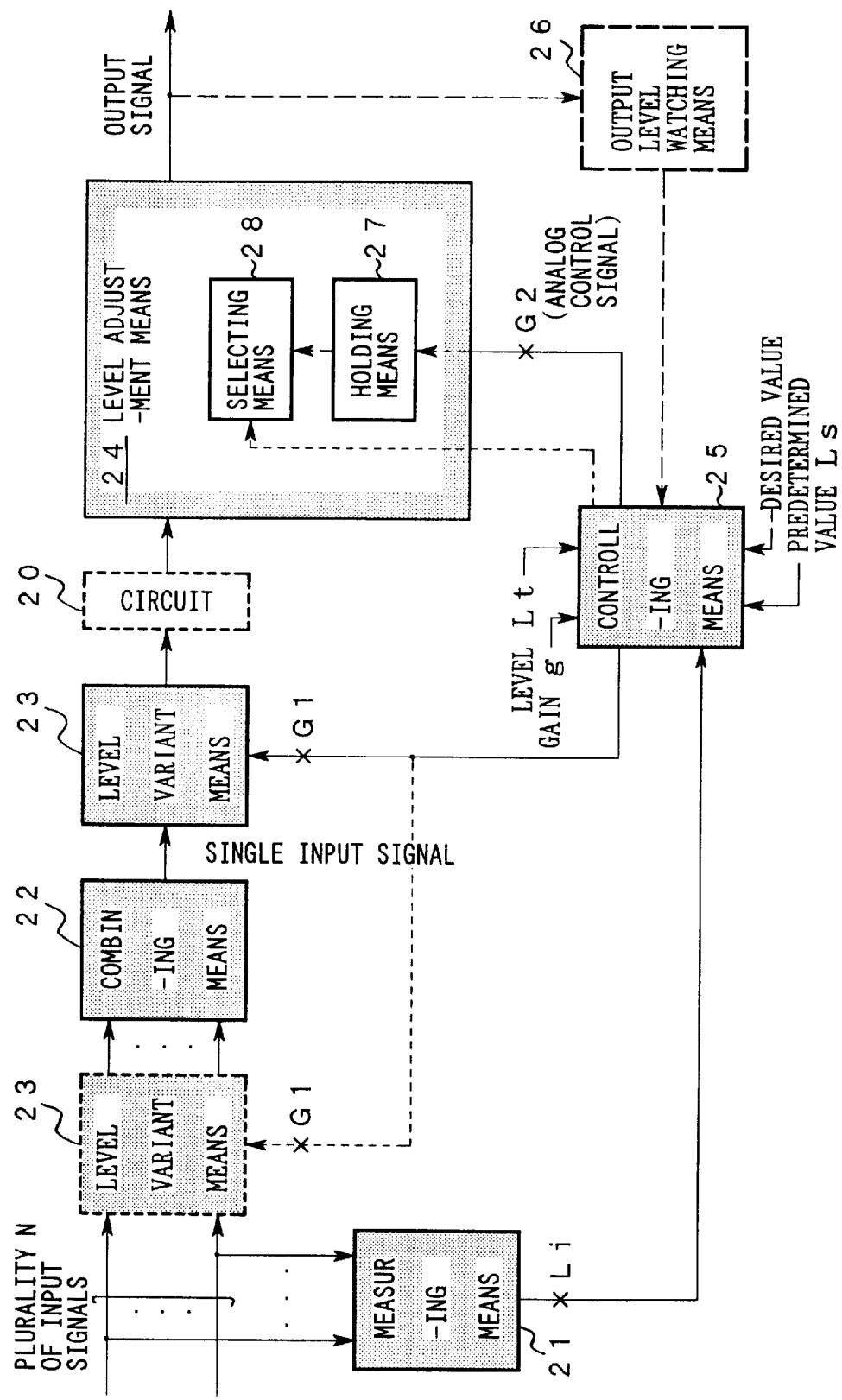
FIG. 2 is a block diagram showing a principle of another power control circuit according to the present invention.

FIG. 2 is a block diagram showing the principle of another power control circuit according to the invention.

The second power control circuit according to the invention comprises: measuring means 21 for measuring the level Li of a specific input signal to meet the requirement for the circuit 20 making a desired response to make to the desired response, among a plurality N of input signals fed in parallel, when fed with a signal at a predetermined level Ls; combining means 22 for combining the plurality N of input signals to generate a single input signal; level variant means 23 for amplifying the single input signal, which is generated by the combining means 22 and is to be fed to the circuit 20, at a stage prior or subsequent to the combining means 22 with the first gain G1; level adjustment means 24 for amplifying an output signal obtained as the response of the circuit 20, with the second gain G2; and controlling means 25 for setting the first gain G1 to a ratio between the predetermined level Ls and the level Li measured by the measuring means 21 and for setting the second gain G2 to a ratio between the level Lt of an output signal to be obtained at the output terminal of the level adjustment means 24 and the product of the predetermined level Ls and the gain g of the circuit 20 in a condition for making the desired response.

The principle of the second power control circuit according to the invention is as follows.

The combining means 22 generates the single input signal by combining the plurality N of input signals fed in parallel. The circuit 20 makes the desired response when fed with the signal at the predetermined level Ls. The level variant means 23 amplifies the single input signal, which is generated by the combining means 22 and is to be fed to the circuit 20, as described above, at the stage prior or subsequent to the combining means 22 with the first gain G1.

On the other hand, the measuring means 21 measures the level Li of a specific input signal to meet the requirement for the circuit 20 making a desired response to make the desired response, among a plurality of input signals fed in parallel, when fed with a signal at a predetermined level Ls. The level adjustment means 24 amplifies the output signal obtained as the response of the circuit 20 with the second gain G2.

Moreover, the controlling means 25 sets the first gain G1 to the ratio between the above-described predetermined level Ls and the level Li measured by the measuring means 21. Furthermore, the controlling means 25 sets the second gain G2 to the ratio between the level Lt of the output signal to be obtained at the output terminal of the level adjustment means 24, and the product of the predetermined level Ls and the gain g of the circuit 12 in a condition for making the desired response described above.

Specifically, at the individual stages from the input terminal of the combining means 22 through the level variant circuit 23 and the circuit 20 to the output terminal of the level adjustment means 24, the level diagram is distributed while maintaining the condition for meeting the requirement for the circuit 20 to make the desired response, and the output signal at the desired level Lt is obtained at the output terminal of the level adjustment means 24 even if the level of the input signal fluctuates.

Therefore, even if there is a wide range for the level of the input signal to fluctuate, the desired characteristics and performances are maintained at a highly accurate level.

A third power control circuit according to the invention is configured, in the above-described first or second power control circuit, such that the controlling means 15 and 25 set the second gain G2 prior to the first gain G1 over a time period equal to a difference between the period for which the gains of the level adjustment means 14 and 24 reach a stationary value in accordance with a change in the second gain G2 and a period for which the gains of the level variant means 13 and 23 reach a stationary value in accordance with a change in the first gain G1.

The principle of the third power control circuit according to the invention is as follows.

The difference between the time constants of the level adjustment means 14 and 24 and the level variant means 13 and 23, respectively, is absorbed such that the controlling means 15 and 25 set the second gain, as described above.

As a result, the excess and deficiency of the gains, which may transiently occur at the level adjustment means 14 and 24 and/or the level variant means 13 and 23, are avoided.

A fourth power control circuit according to the invention is constructed, in any of the foregoing first to third power control circuits, such that there is provided output level watching means 26 for measuring the levels of the output signals obtained at the output terminals of the level adjustment means 14 and 24, and such that the controlling means 15 and 25 are given in advance a desired value at a level of the output signal to be obtained at the output terminals of the level adjustment means 14 and 24, and vary the second gain G2 to a value at which a deviation of the level measured by the output level watching means 26 from the desired value is suppressed.

The principle of the fourth power control circuit according to the invention is as follows.

Since the controlling means 15 and 25 vary the second gain G2 to the above-described value, the levels of the output signals to be obtained at the output terminals of the level adjustment means 14 and 24 are kept at the above-described desired value under a feedback control.

As a result, there is avoided a degradation of performance, which is caused by the fluctuation or deviation of the characteristics of the combining means 22, the level variant means 13 and 23 and the circuits 12 and 20 arranged at the prior stage of the level adjustment means 14 and 24.

A fifth power control circuit according to the invention is constructed, in any of the foregoing first to fourth power control circuits, such that the specific level Ls is a value at which the SN ratio of the output signals to be obtained at the output terminals of the circuits 12 and 20 is maximized according to the characteristics of the circuits 12 and 20.

The principle of the fifth power control circuit according to the invention is as follows.

Since the predetermined level Ls is at the above-described value, at the output terminals of the level adjustment means 14 and 24, output signals of a satisfactory SN ratio and at the desired level Lt are obtained irrespective of the levels of one or more input signals given to the combining means 22 or the level variant means 13 and 23, so that the level of the reliability and the performance are maintained stable.

A sixth power control circuit according to the invention is constructed, in any of the above-described first to fifth power control circuits, such that the controlling means 15 and 25 feed the level adjustment means 14 and 24 with an analog control signal indicating the second gain G2 with an instantaneous value of voltage or current, and such that the level adjustment means 14 and 24 include holding means 27 for holding the instantaneous values of a plurality of analog control signals fed by the controlling means 15 and 25, cyclically in the order of time series; and selecting means 28 for applying the newest instantaneous value under the control of the control means 15 and 25 among the instantaneous values of the plurality of analog control signals held by the holding means 27.

The principle of the sixth power control circuit according to the invention is as follows.

According to the configuration described above, the analog control signals are transmitted from the controlling means 15 and 25 to the level adjustment means 14 and 24 through a single signal line so that the instantaneous voltage or current values of the analog control signals can be expressed with the second gain G2 as desired multiple values.

The larger the number of second gain G2 to be expressed by such multiple-value is, therefore, the smaller the number of signal lines connecting between the controlling means 15 and 25 and the level adjustment means 14 and 24 becomes, and restrictions on the packaging and component orientation are relaxed.

A seventh power control circuit according to the invention is configured, in any of the foregoing first to sixth power control circuits, such that the controlling means 15 and 25 set the first gain G1 to the value which is given in accordance with a hysteresis in the level Li measured by the measuring means 11 and 21 and for which errors of the responses of the circuits 12 and 20 are tolerated.

The principle of the seventh power control circuit according to the invention is as follows.

According to the above-described configuration, even when the levels of one or more input signals fed to the combining means 22 or the level variant means 13 and 23 frequently fluctuate, the levels of the input signals to be fed to the circuits 12 and 20 are maintained stable at a highly accurate level at the value for the desired responses of the circuits 12 and 20, and the performance is also maintained stable.

Figure 3:
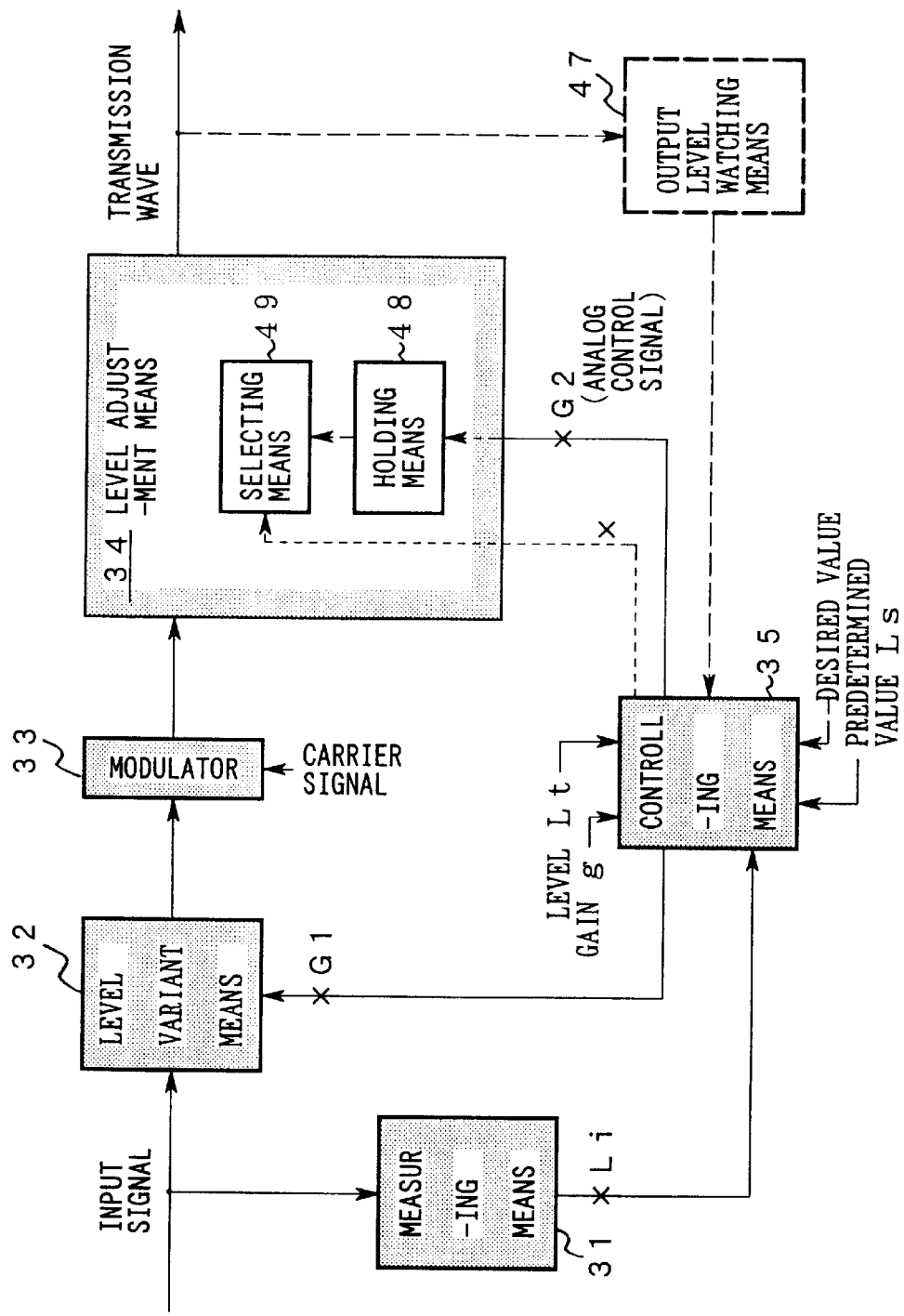
FIG. 3 is a block diagram showing a principle of a transmitter according to the present invention.

FIG. 3 is a block diagram showing the principle of a transmitter according to the invention.

The first transmitter according to the invention is comprises: measuring means 31 for measuring the level Li of an input signal; level variant means 32 for amplifying the input signal with a first gain G1; a modulator 33 for generating a modulated wave by modulating a carrier signal in accordance with the input signal fed through the level variant means 32, the modulator having a desired characteristics when fed with a signal at a predetermined level Ls; level adjustment means 34 for generating a transmission wave to be sent to a transmission channel by amplifying the modulated wave generated by the modulator 33, with a second gain G2; and controlling means 35 for setting the first gain G1 to a ratio between the predetermined level Ls and the level Li measured by the measuring means 31 and for setting the second gain G2 to a ratio between a level Lt of a transmission wave to be obtained at the output terminal of the level adjustment means 34 and the product of the predetermined level Ls and a gain g of by the modulator 33 in a condition for making the desired response.

The principle of the first transmitter according to the invention is as follows.

The modulator 33 makes the desired response when fed with a signal at the predetermined level Ls. The level variant means 32 amplifies the input signal with the first gain G1 and feeds the amplified signal to the modulator 33. The measuring means 31 measures the level Li of the input signal, and the level adjustment means 34 amplifies the output signal obtained as the response of the modulator 33 with the second gain G2.

On the other hand, the controlling means 35 sets the first gain G1 to the ratio between the above-described predetermined level Ls and the level Li measured by the measuring means 31. Moreover, the controlling means 35 sets the second gain G2 to the ratio between the level Lt of the output signal to be obtained at the output terminal of the level adjustment means 34, and the product of the predetermined level Ls and the gain g of the modulator 33 in the condition making the above-described desired response.

Specifically, at the individual stages from the input terminal of the level variant means 32 through the modulator 33 to the output terminal of the level adjustment means 34, the level diagram is distributed while maintaining the condition for meeting the requirement for the modulator 33 to make the desired response, and the output signal at the desired level Lt is obtained at the output terminal of the level adjustment means 34 in case the level of the input signal fluctuates.

Therefore, even if there is a wide range for the level of the input signal to fluctuate is wide, the desired characteristics and performances are maintained at a highly accurate level.

Figure 4:
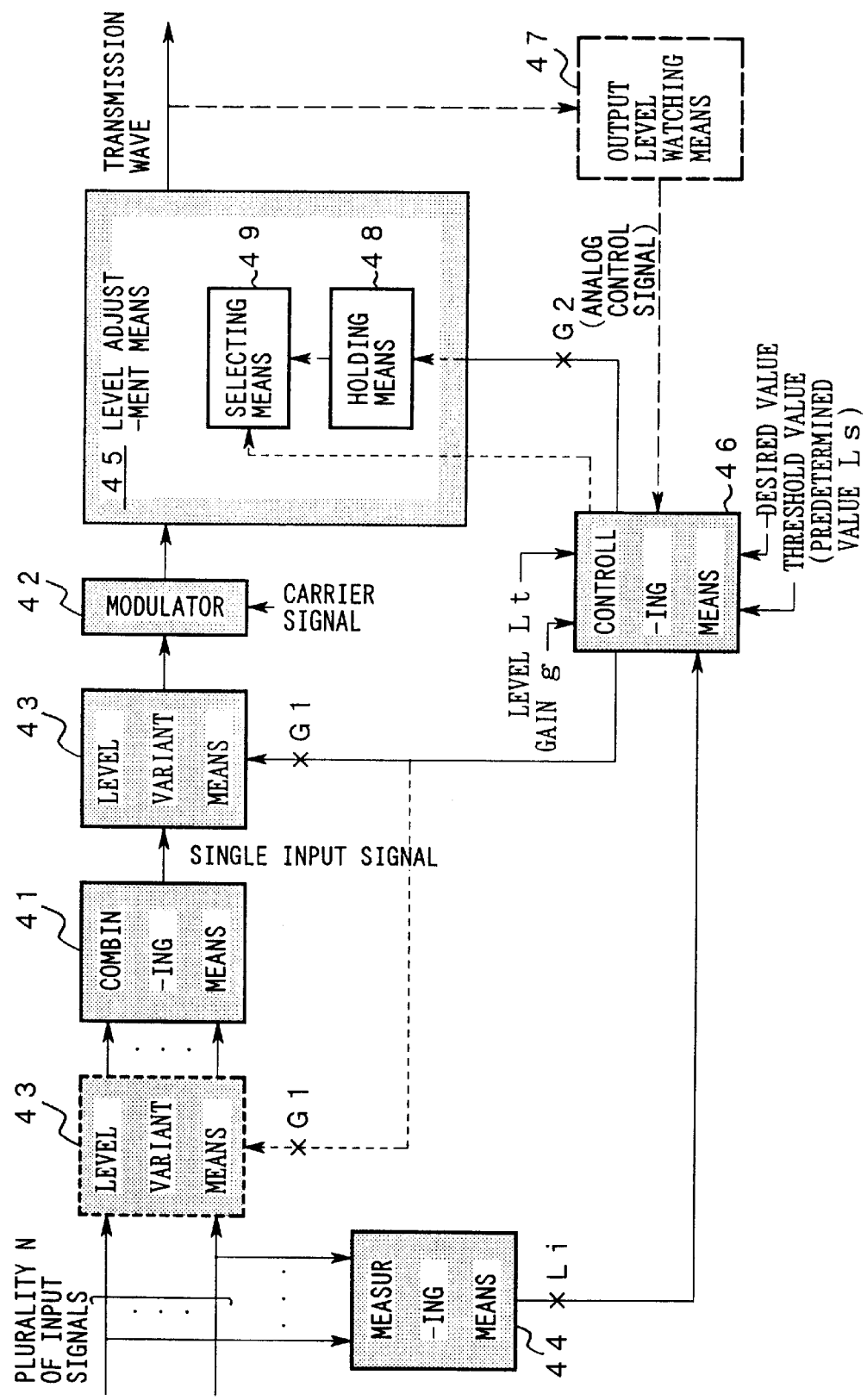
FIG. 4 is a block diagram showing a principle of another transmitter according to the present invention.

FIG. 4 is a block diagram showing the principle of another transmitter according to the invention.

The second transmitter according to the invention comprises: combining means 41 for combining a plurality of input signals fed in parallel and generating a single input signal; a modulator 42 for generating a modulated wave by modulating a carrier signal in accordance with a single input signal inputted, the modulation having desired characteristic when the level of the single input signal is at a predetermined level Ls; level variant means 43 for amplifying with a first gain G1, the single input signal to be fed through the combining means 41 to the modulator 42, at a stage prior or subsequent to the combining means 41; measuring means 44 for measuring the levels of a plurality N of input signals; level adjustment means 45 for generating a transmission wave to be sent to a transmission channel, by amplifying the modulated wave generated by the modulator 42, with the second gain G2; and controlling means 46 for reducing the first gain G1 of the level variant means 43 and enlarging the second gain G2 of the level adjustment means 45, when the level of at least one input signal exceeds a threshold value in the measuring means 44.

The principle of the second transmitter according to the invention is as follows.

The combining means 41 generates a single input signal by combining the plurality N of input signals given in parallel. The modulator 42 generates the modulated wave by modulating the carrier signal in accordance with the single input signal inputted, to and has desired characteristics when the level of the single input signal is the predetermined level Ls. The level variant means 43 amplifies the single input signal, which is generated by the combining means 41 and is to be fed to the modulator 42, as described above, at the stage prior or subsequent to the combining means 41, with the first gain G1.

On the other hand, the measuring means 44 measures the levels of the plurality N of input signals. The level adjustment means 45 amplifies the modulated wave generated by the modulator 42 with the second gain G2.

Moreover, the controlling means 46 reduces the first gain G1 of the level variant means 43 and enlarges the second gain G2 of the level adjustment means 45 when the level of at least one input signal exceeds the threshold value in the measuring means 44.

Specifically, at the individual stages from the input terminal of the combining means 41 through the level variant means 43 and the modulator 42 to the output terminal of the level adjustment means 45, the level diagram is in a condition that the degradation of the characteristics of the modulator 42 is reduced or suppressed due to the rise in the level of the input signal.

Therefore, even when the level of the input signal rises, the desired characteristics and performances are maintained at a highly accurate level.

A third transmitter according to the invention is configured, in the above-described first or second transmitter, such that the controlling means 35 and 46 set the second gain G2 prior to the first gain G1 over a time period equal to a difference between the time period for which the gains of the level adjustment means 34 and 45 reach a stationary value in accordance with a change in the second gain G2 and a time period for which the gains of the level variant means 32 and 43 reach a stationary value in accordance with a change in the first gain G1.

The principle of the third transmitter according to the invention is as follows.

According to the above-described configuration, the difference between the time constants of the level adjustment means 34 and 45 and the level variant means 32 and 43 respectively, is absorbed so that the excess and deficiency of the gains are avoided at the level adjustment means 34 and 45 and/or the level variant means 32 and 43.

A fourth transmitter according to the invention is configured, in the above-described first or third transmitters, such that there is provided output level watching means 47 for measuring the levels of the transmission waves obtained at the output terminals of the level adjustment means 34 and 45, and such that the controlling means 35 and 46 are given in advance a desired value at a level of the transmission wave to be obtained at the output terminals of the level adjustment means 34 and 45, and vary the second gain G2 to a value at which a deviation of the level measured by the output level watching means 47 from the desired value is suppressed.

The principle of the fourth transmitter according to the invention is as follows.

According to the above-described configuration, the levels of the transmission waves to be obtained at the output terminals of the level adjustment means 34 and 45 are kept at the above-described desired value under a feedback control so that a degradation of performance is avoided, of which the degradation is caused by the fluctuation or deviation of the characteristics of the combining means 41, the level variant means 32 and 43 and the modulators 33 and 42 disposed at the prior stage of the level adjustment means 34 and 45.

A fifth transmitter according to the invention is configured, in the above-described first to fourth transmitters, such that the predetermined level Ls is a value at which the SN ratio of the modulated waves generated by the modulators 33 and 42 is maximized according to the characteristics of the modulators 33 and 42.

The principle of the fifth transmitter according to the invention is as follows.

Since the specific level Ls is set to the above-described value, transmission waves of a satisfactory SN ratio and at the desired level Lt are obtained at the output terminals of the level adjustment means 34 and 45 irrespective of the levels of one or more input signals given to the combining means 41 or the level variant means 32 and 43, so that the level of the reliability and the performance are maintained stable.

A sixth transmitter according to the invention is configured, in the above-described first or fifth transmitters, such that the controlling means 35 and 46 feeds the level adjustment means 34 and 45 with an analog control signal indicating the second gain G2 with an instantaneous value of a voltage or current, and such that the level adjustment means 34 and 45 include: holding means 48 for holding the instantaneous values of a plurality of analog control signals fed by the controlling means 35 and 46, cyclically in the order of time series; and selecting means 49 for applying the newest instantaneous value under the control of the control means 35 and 46, among the instantaneous values of the plurality of analog control signals held by the holding means 48.

The principle of the sixth transmitter according to the invention is as follows.

According to the configuration described above, the above-described analog control signals are transmitted from the controlling means 35 and 46 to the level adjustment means 34 and 45 through a single signal line so that the instantaneous voltage or current values of the analog control signals can be expressed with the second gain G2 as desired multiple-value.

Therefore, with the number of second gains G2 to be expressed as such multiple values larger, the number of signal lines connecting the controlling means 35 and 46 and the level adjustment means 34 and 45 is reduced, and restrictions on the packaging and component orientation are eased.

A seventh transmitter according to the invention is configured in the above-described first to sixth transmitters, such that the controlling means 35 and 46 set the first gain G1 to the value which is given in accordance with a hysteresis in the level Li measured by the measuring means 31 and 44, and at which errors through the modulation processing to be made by the modulators 33 and 42 are tolerable.

The principle of the seventh transmitter according to the invention is as follows.

According to the above-specified configuration, even if the levels of one or more input signals to be fed to the combining means 41 or the level variant means 32 and 43 frequently fluctuate, the levels of the input signals fed to the modulators 33 and 42 are maintained stable at a highly accurate level at the value for the desired responses of the modulators 33 and 42, and the performance is maintained stable.

The embodiments of the present invention will be described in detail with reference to the accompanying drawings.

Figure 5:
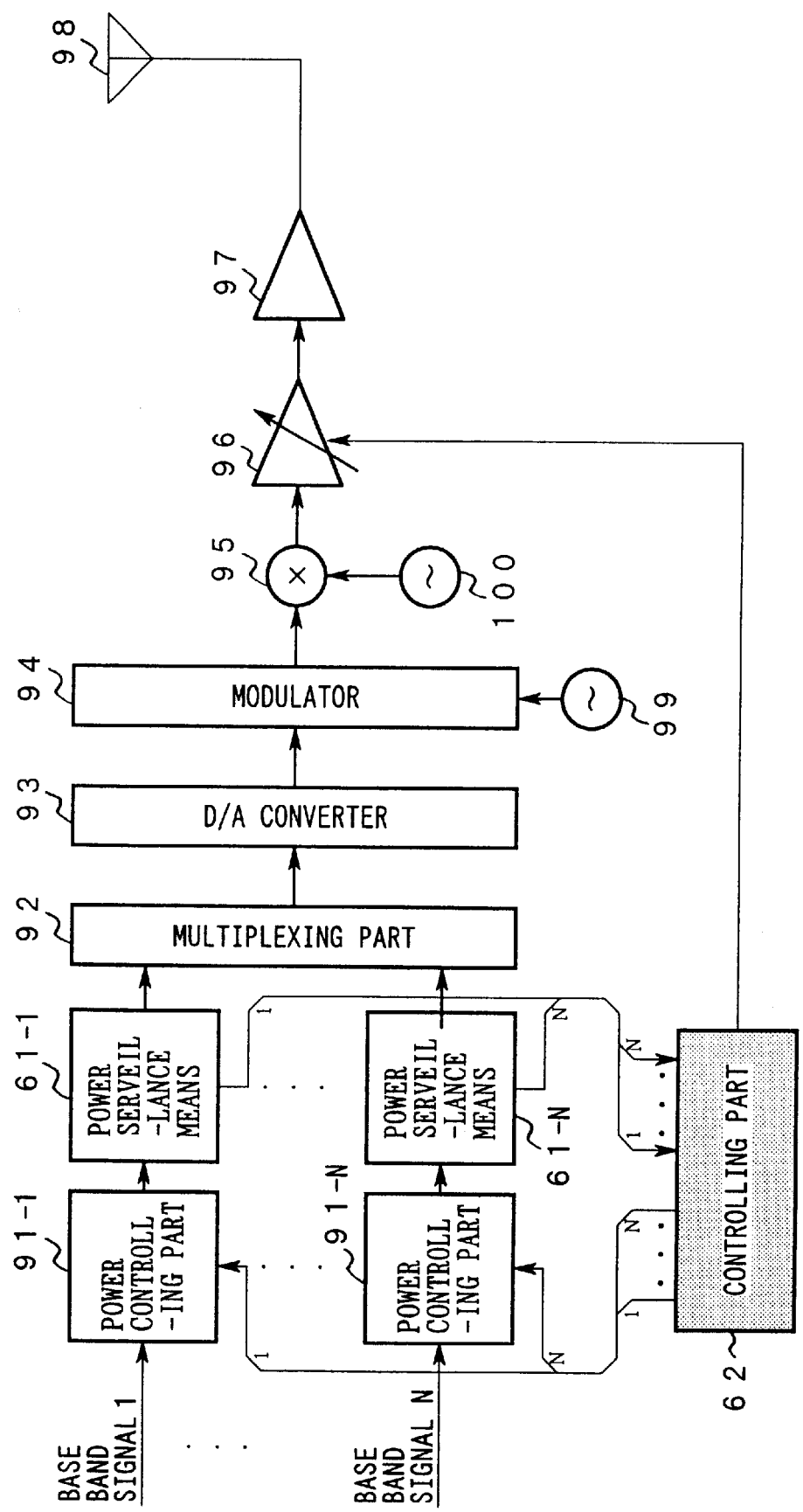
FIG. 5 is a block diagram showing the first, second, and sixth embodiments according to the present invention.

FIG. 5 is a block diagram showing the first, second, and sixth embodiments of the present invention.

Figure 14:
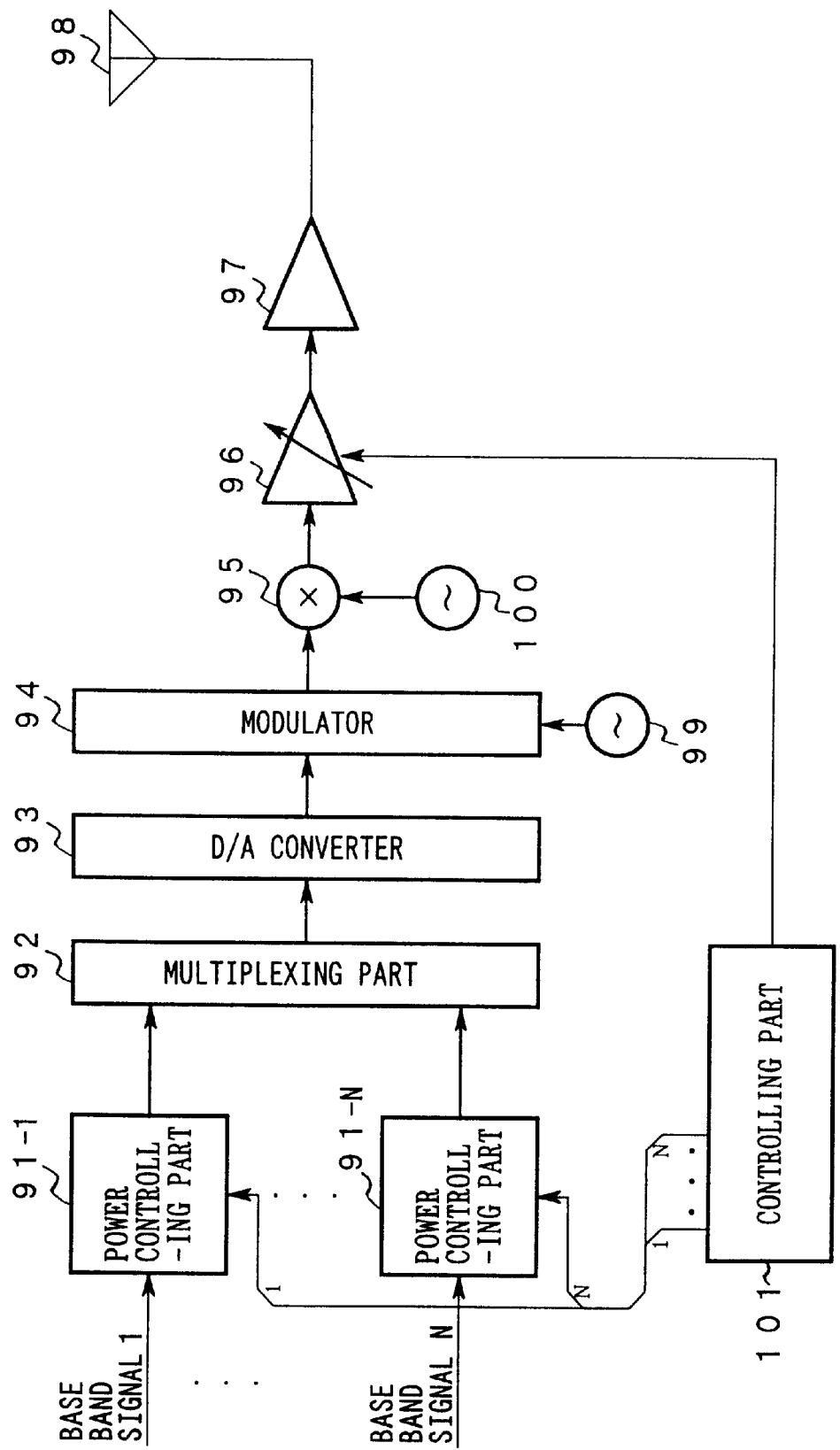
FIG. 14 is a block diagram showing an example of the configuration for a transmission part of a radio base station of a mobile communication system to which a CDMA system is applied.
Figure 15:
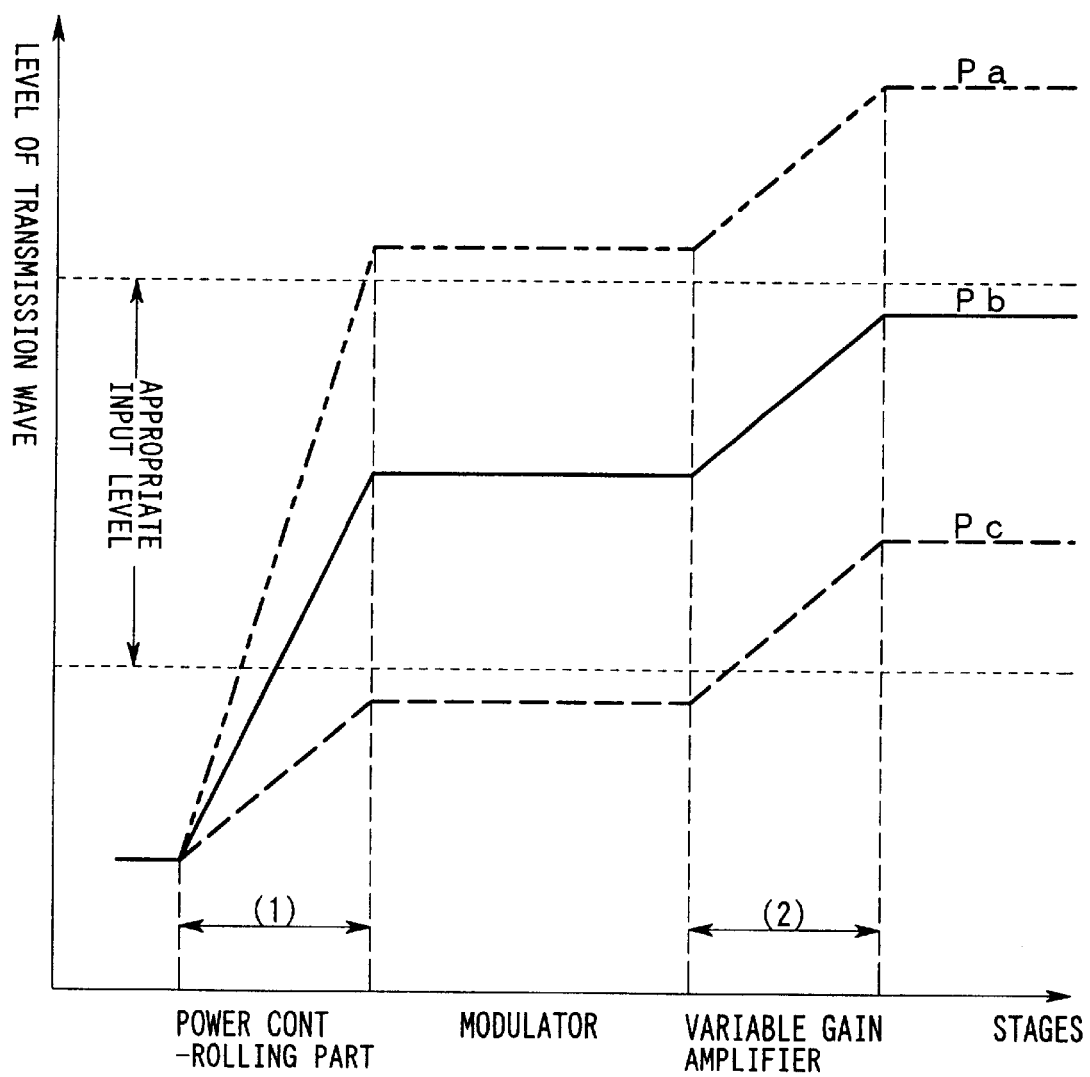
FIG. 15 is a chart for explaining the operations of the example of the prior art.

In FIG. 5, the components that have the same function and configuration are indicated by identical reference numerals as in FIG. 14 and the description thereof will be omitted here.

The differences of the configurations between the present embodiment and the prior art shown in FIG. 14 are in that power surveillance parts 61-1 to 61-N are respectively disposed at the inter-stages between the power controlling parts 91-1 to 91-N and the multiplexing part 92; the controlling part 101 is replaced by a controlling part 62; the surveillance outputs of the power surveillance parts 61-1 to 61-N are respectively connected with the input ports of the controlling part 62; and a specific output port of the controlling part 62 is connected with the control terminal of the variable gain amplifier 96.

Furthermore, as for the corresponding relationship between the components of the present embodiments and the components shown in FIGS. 1 through 4: the power surveillance parts 61-1 to 61-N correspond to the measuring means 11, 21, 31, and 44; the modulator 94, the multiplier 95, and the oscillators 99 and 100 correspond to the circuits 12 and 20; the modulator 94 corresponds to the modulators 33 and 42; the power controlling parts 91-1 to 91-N correspond to the level variant means 13, 23, 32, and 43; the variable gain amplifier 96 corresponds to the level adjustment means 14, 24, 34, and 45; the controlling part 62 corresponds to the controlling means 15, 25, 35 and 46; and the multiplexing part 92 and the D/A converter 93 correspond to the combining means 22 and 41.

Figure 6:
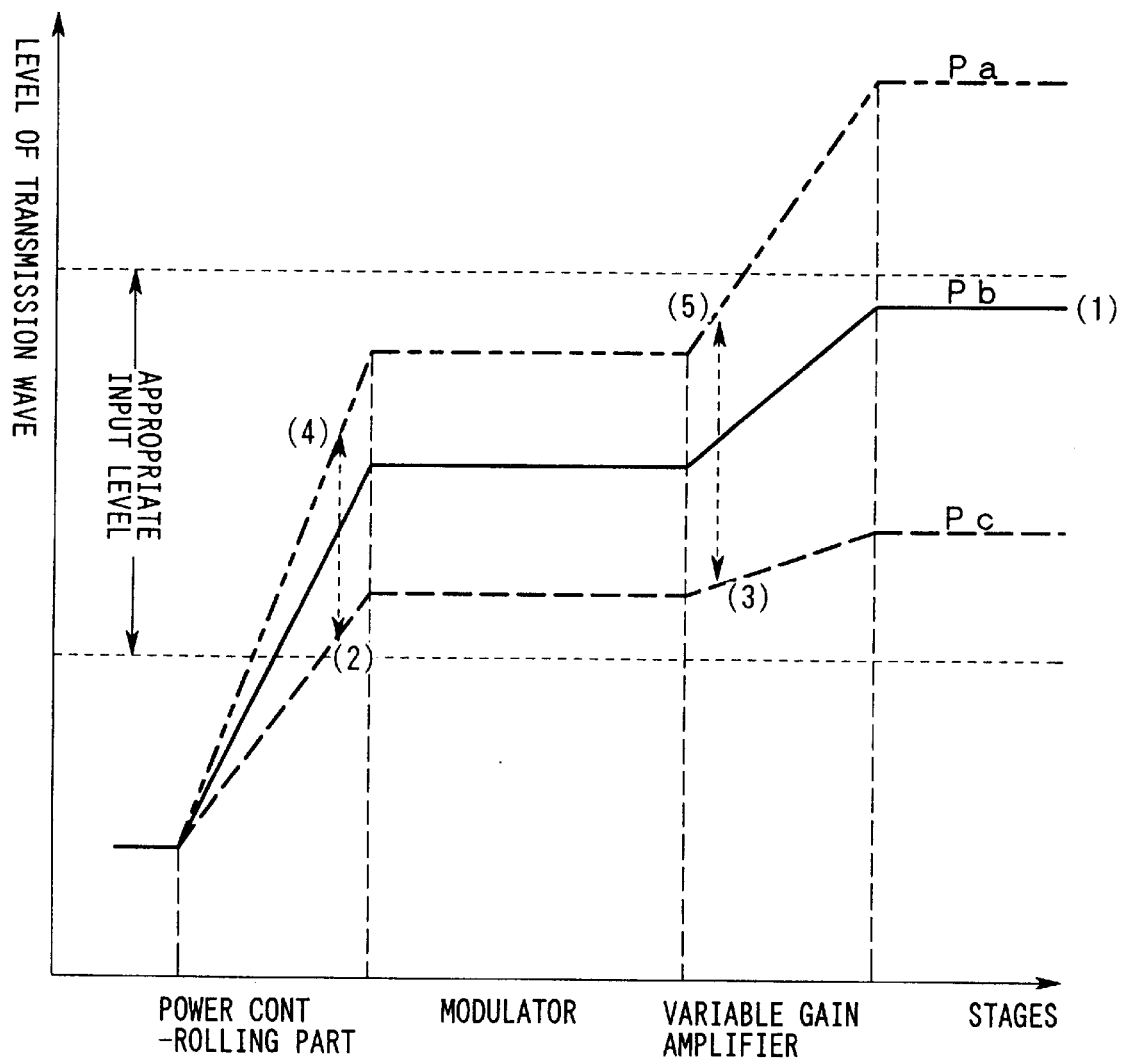
FIG. 6 is a chart for explaining the operations of the first, second, and sixth embodiments according to the present invention.

FIG. 6 is a chart for explaining the operations of the first, second, and sixth embodiments according to the present invention.

Figure 7:
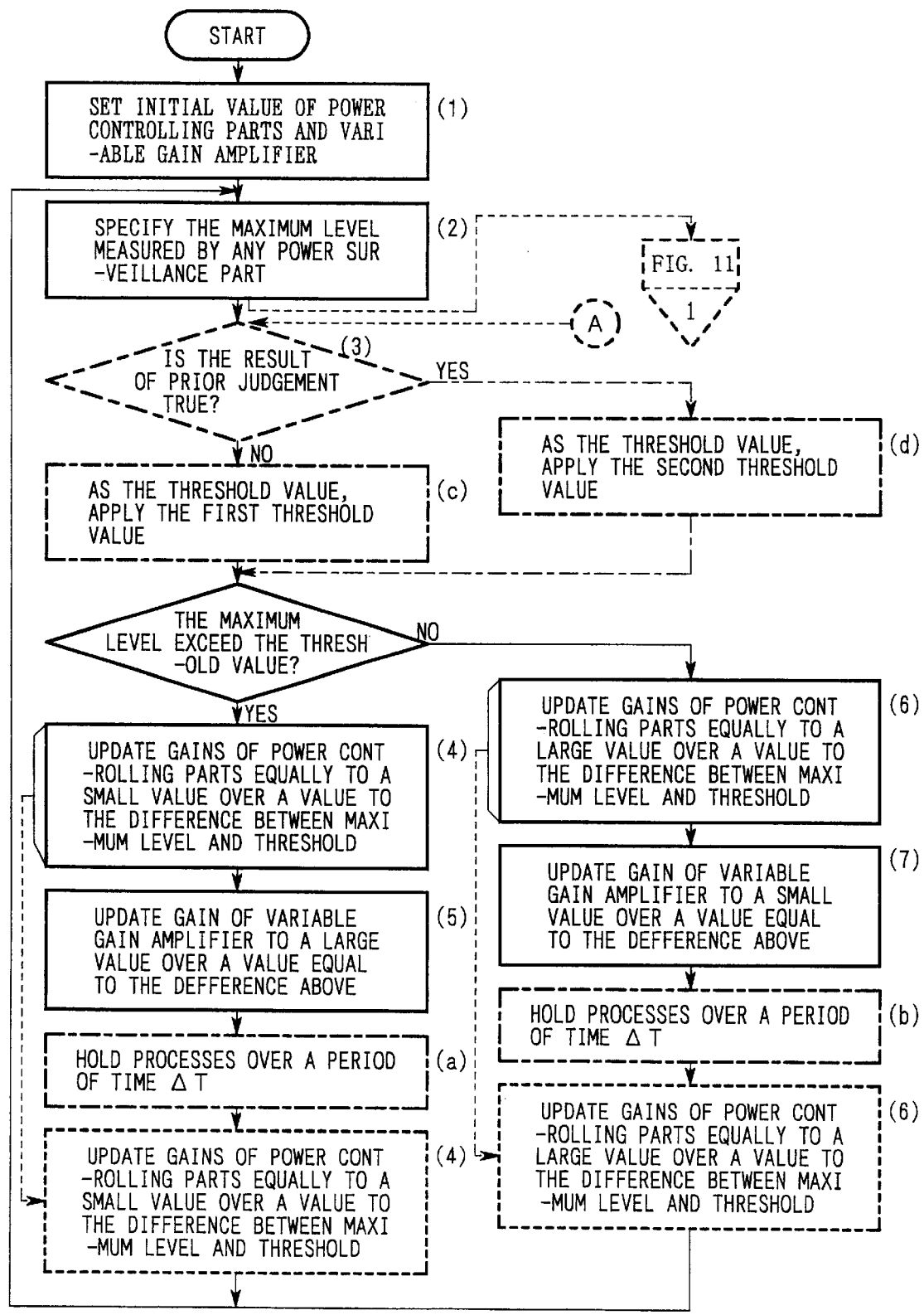
FIG. 7 is a flow chart of the operations of the first, second, and sixth embodiments according to the present invention.

FIG. 7 is a flow chart of the operations of the first, second, and sixth embodiments according to the present invention.

In the following, the operations of the first embodiment according to the present invention will be described with reference to FIGS. 5 through 7.

For the analog signal to be inputted to the modulator 94, the controlling part 62 has, in advance, the level (hereinafter referred to as "appropriate input level") which corresponds to a generally middle point of a level range, wherein the modulation distortion of the modulator 94 can be stably obtained at a small value, as a threshold value, as illustrated in FIG. 16(a)(1).

And, at a starting time, the controlling part 62 sets initial values satisfying the following conditions (FIG. 6(1) and FIG. 7(1)), as the gains of the power controlling parts 91-1 to 91-N and the variable gain amplifier 96.

(1) The level of the analog signal to be inputted to the modulator 94 is the above-described threshold value when the levels of the base band signals to be individually inputted to the power controlling parts 91-1 to 91-N are at a reference value.

(2) The level of the transmission wave to be fed to the feeding point of the antenna 98 is the value corresponding to the predetermined transmitting power.

Furthermore, the controlling part 62 performs the "transmitting power control" by varying the gains of the power controlling parts 91-1 to 91-N as in the controlling part 101 shown in FIG. 14 and also performs the following processes along with the "transmitting power control".

The power surveillance parts 61-1 to 61-N measure the levels of the base band signals, as respectively fed via the power controlling parts 91-1 to 91-N, in the base band region, and inform the controlling part 62 of the measured levels.

The controlling part 62 specifies (FIG. 6(2)) the level of being maximum (hereinafter referred to as "maximum level"), and judges (FIG. 7(3)) whether or not the maximum level exceeds the above-described threshold value.

Besides, when the judging result is true, the controlling part 62 updates the gains of the power controlling parts 91-1 to 91-N uniformly (FIG. 6(2) and FIG. 7(4)) to a small value over a value equal to the difference between the maximum level and the threshold value, and updates the gain of the variable gain amplifier 96 (FIG. 6(3) and FIG. 7(5)) to a large value over a value equal to the difference as well.

When the judging result described above is false, however, the controlling part 62 updates the gains of the power controlling parts 91-1 to 91-N equally (FIG. 6(4) and FIG. 7(6)) to a large value over a value equal to the difference between the maximum level and the threshold value, and updates the gain of the variable gain amplifier 96 (FIG. 6(5) and FIG. 7(7)) to a small value over the value equal to the difference as well.

That is, the overall gain of a section leading from the power controlling parts 91-1 to 91-N, through the power surveillance parts 61-1 to 61-N, the multiplexing part 92, the D/A converter 93, the modulator 94, the multiplier 95, and the variable gain amplifier 96, to the input terminal of the amplifier 97 is fitly updated to an appropriate value under the "transmitting power control" while the level of the analog signal fed to the modulator 94 is kept at the above-described "appropriate input level".

Thus, according to the present embodiment, even when the dynamic range of the gain of the transmission part to be varied under the transmitting power control is wide, the level of the analog signal to be inputted to the modulator 94 is held at the "appropriate input level" so that the transmission quality is kept high.

Furthermore, in the present embodiment, the dynamic range of the analog signal to be inputted to the modulator 94 is suppressed more than the prior art, the active modulator can be applied in place of the passive modulator having a high changing rate of characteristics with respect to the temperature, and the power consumption can be reduced while making the size and weight of the hardware small.

In the following, the operations of the second embodiment according to the invention will be described with reference to FIGS. 5 through 7.

The difference between the present embodiment and the above-described first embodiment is the procedure of the following processes to be executed by the controlling part 62 at the time of updating the gains of the power controlling parts 91-1 to 91-N and the gains of the variable gain amplifier 96.

The gains of the power controlling parts 91-1 to 91-N are updated or set substantially instantaneously in the digital region.

However, since the variable gain amplifier 96 has a time constant suited for the circuit configuration, a new gain does not take a stationary value before a time constant or a longer period elapses, even when the "instruction to update the gains" is given by the controlling part 62.

Therefore, the following unequal relation generally holds between the time periods Td and Ta for new gains given by the controlling part 62 to become stationary value respectively at the power controlling parts 91-1 to 91-N and the variable gain amplifier 96:

$$Ta \gg Td.$$

The controlling part 62 is given a difference $\Delta T$ ($=Ta-Td$) between the time periods Ta and Td, as determined in advance as a measured value or a theoretical value.

Moreover, the controlling part 62 preferentially performs (FIG. 7(5) and (7)) the processes of updating the gain of the variable gain amplifier 96, as indicated by dotted lines and dotted arrows in FIG. 17, and then holds (FIGS. 7($a$) and ($b$)) the processes (FIG. 7 (4) and (6)) of updating the gains of the power controlling parts 91-1 to 91-N equally over a period of time equal to the difference $\Delta T$.

That is, the gains of the power controlling parts 91-1 to 91-N and the variable gain amplifier 96 are substantially simultaneously updated while the difference between the time constants intrinsic to the power controlling parts 91-1 to 91-N and the variable gain amplifier 96 being absorbed.

Thus, as long as the above-described difference $\Delta T$ is given in advance in a desired accuracy as a known value, the transmitting power control conforming flexibly to the fluctuation of the transmission characteristics of each radio channel is stably performed.

Besides, in the present embodiment, the variable gain amplifier 96 is disposed at an inter-stage between the multiplier 95 and the amplifier 97.

Figure 8:
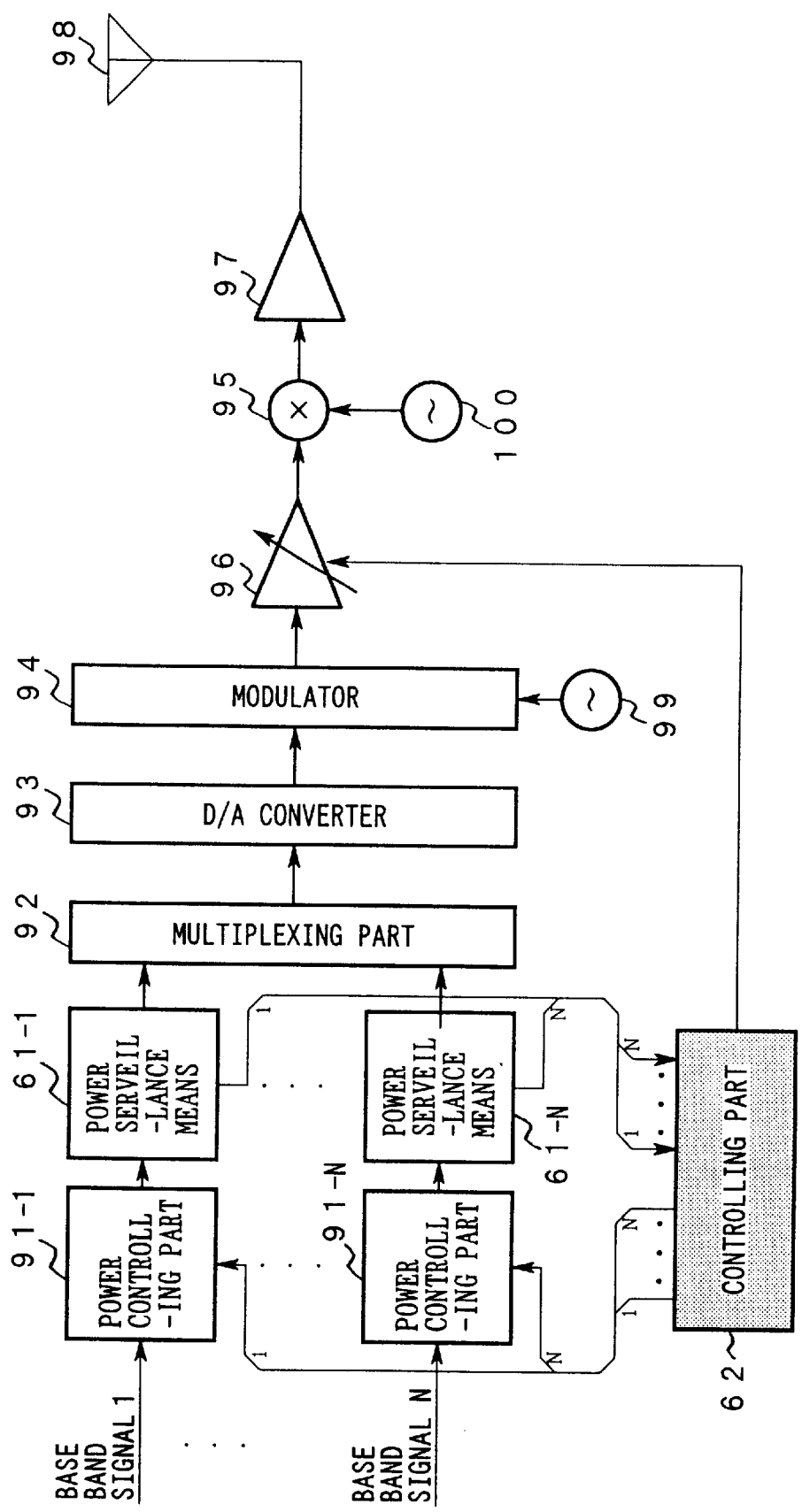
FIG. 8 is a block diagram (1) showing another example of configuration of the second embodiment according to the present invention.
Figure 9:
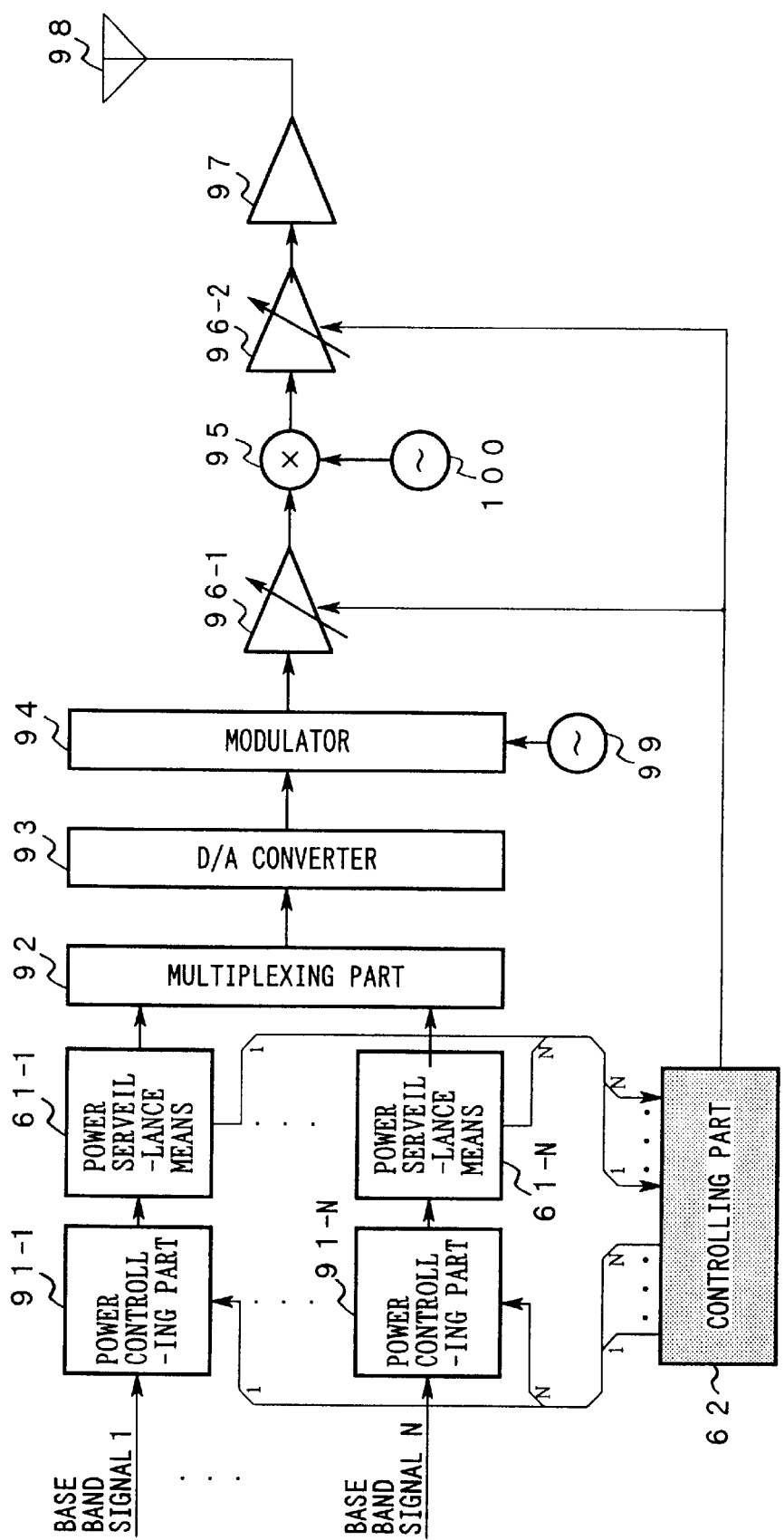
FIG. 9 is a block diagram (2) showing another example of configuration of the second embodiment according to the present invention.

However, the variable gain amplifier 96 may be disposed at an inter-stage between the modulator 94 and the multiplier 95, as shown in FIG. 8, or may be replaced by two variable gain amplifiers 96-1 and 96-2 which are disposed at an inter-stage between the modulator 94 and the multiplier 95 and at an inter-stage between the multiplier 95 and the amplifier 97, respectively, as shown in FIG. 9.

Besides, in the present embodiment, the difference $\Delta T$ between the time constants intrinsic to the power controlling parts 91-1 to 91-N and the variable gain amplifier 96 is absorbed under the above-described processes executed by the controlling part 62.

However, the processes described above need not be executed in the least when the difference $\Delta T$ of the time constants is allowably small, when another technique for compensating the similar difference of the time constants is applied, and when there is a sufficiently longer time period than the difference of the time constants until the time point the transmission is started on the basis of the channel setting procedure.

Figure 10:
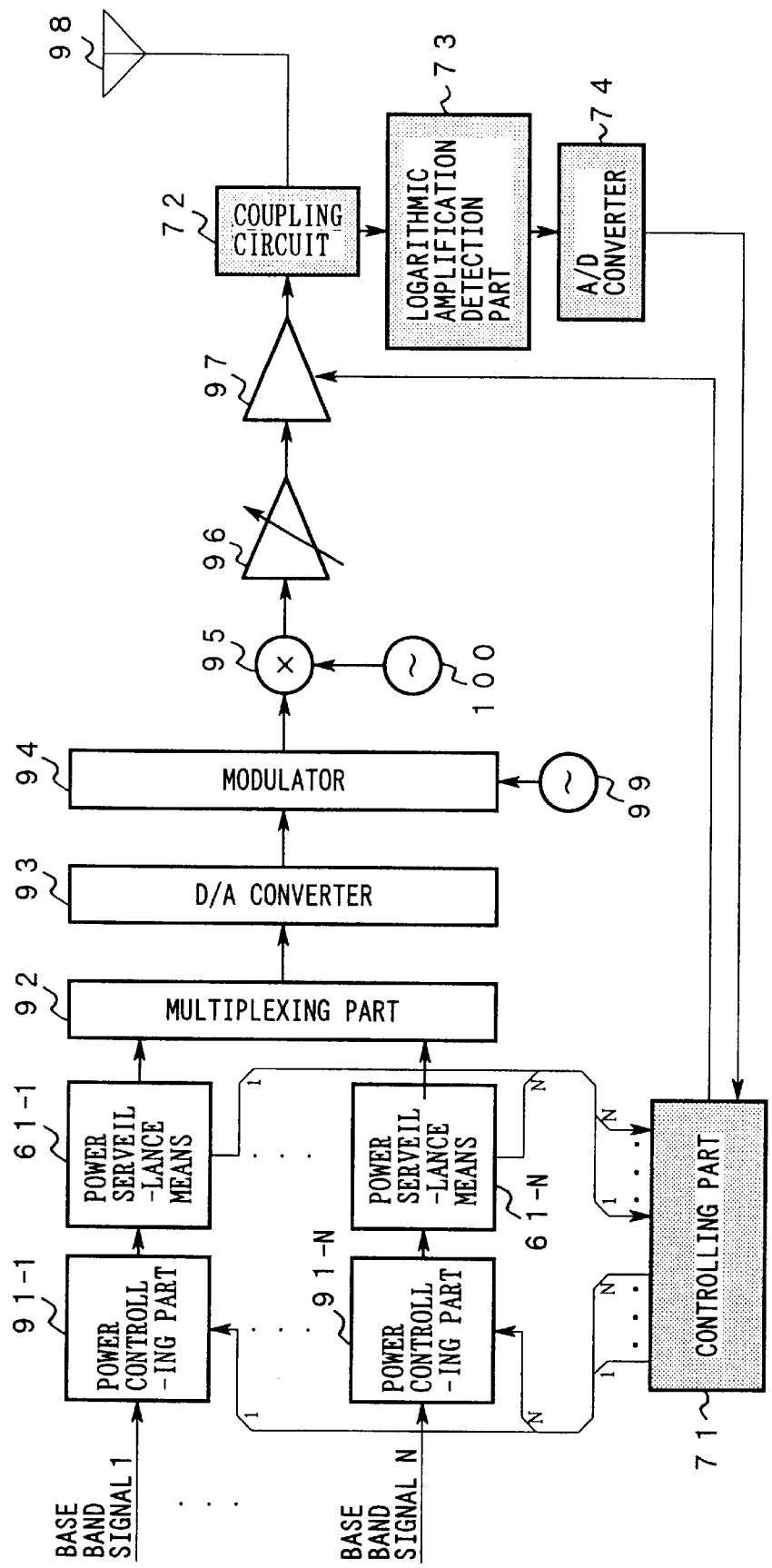
FIG. 10 is a block diagram showing the third and fourth embodiments according to the present invention.

FIG. 10 shows the third and fourth embodiments according to the present invention.

In FIG. 10, the components that have the same function and configuration are indicated by identical reference numerals as in FIG. 5 and the description thereof will be omitted here.

The differences of the configurations between the present embodiments and the embodiment shown in FIG. 5 are that the controlling part 62 is replaced by a controlling part 71; a coupling circuit 72 is added between the amplifier 97 and the feeding point of the antenna 98; and there disposed a logarithmic amplification detection part 73 and an A/D converter 74 which are connected in tandem between the monitor terminal of the coupling circuit 72 and the corresponding input port of the controlling part 71.

Furthermore, the corresponding relationship between the present embodiments and the block diagrams shown in FIGS. 1 through 4 are identical to those in the above-described first and second embodiments, but for the point that the coupling circuit 72, the logarithmic amplification detection part 73, and the A/D converter 74 correspond to the output level watching means 26 and 47.

Figure 11:
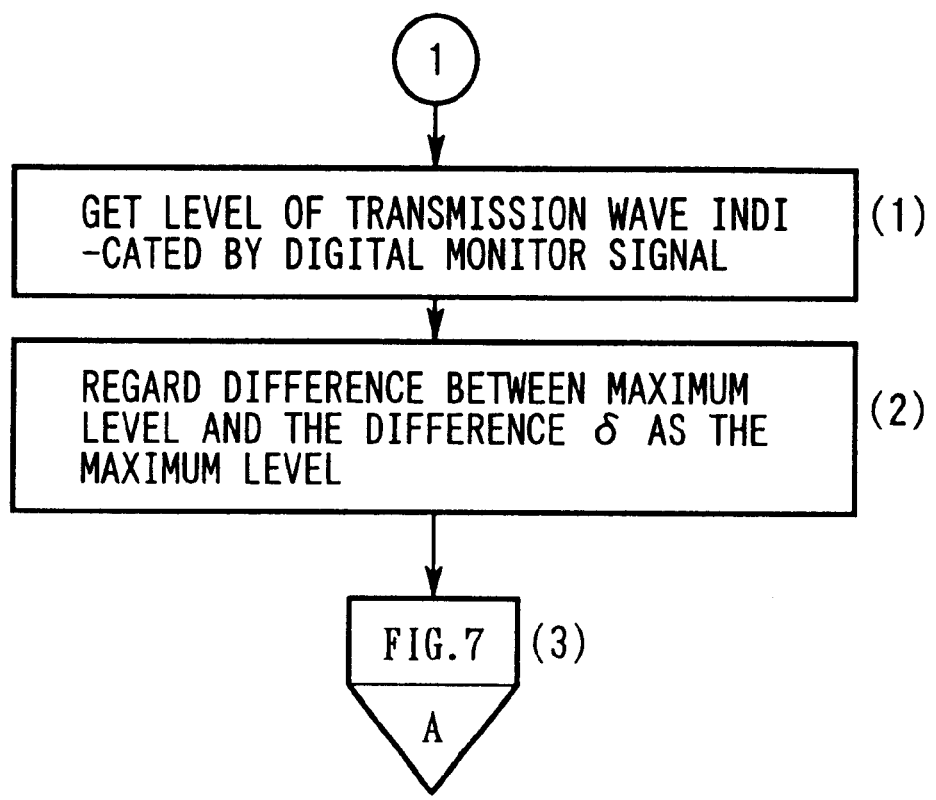
FIG. 11 is a flow chart of the operations of the third embodiment according to the present invention.

FIG. 11 is a flow chart of the operations of the third embodiment according to the invention.

In the following, the operations of the third embodiment according to the present invention will be described with reference to FIGS. 10 and 11.

Like the controlling part 62 in the above-described first and second embodiments, the controlling part 71 initiatively executes the "transmitting power control" and uninterruptedly grasps the appropriate level of the transmission wave (hereinafter referred to as "appropriate transmission level") to be set under the "transmitting power control".

The coupling circuit 72 is coarsely coupled to the feeding line from the output terminal of the amplifier 97 to the feeding point of the antenna 98, thereby to extract a portion of the power of the transmission wave to be fed via the feeding line to the antenna 98.

The logarithmic amplification detection part 73 logarithmically amplifies the transmission wave thus extracted, to generate an analog monitor signal indicating the level of the transmission wave.

The A/D converter 74 converts the monitor signal digitally to generate a digital monitor signal and feed it to the controlling part 71.

The controlling part 71 acquires the level of the transmission wave to be fed to the feeding point of the antenna 98 by the amplifier 97, as the numerical information indicated by such digital monitor signal (FIG. 11(1)).

Moreover, the controlling part 71 regards the difference between the above-described "maximum level" and a difference 6 between the level of the transmission wave and the "appropriate transmission level", as the "maximum level" (FIG. 11(2)), to perform (FIG. 11(3)) processes similar (FIG. 7(4) through (7), ($a$)) to those of the above-described first and second embodiments.

That is, even when the level of the carrier signal generated by the oscillator 99 or the spreading code generated by the oscillator 100, or the characteristics of the modulator 94, the multiplier 95, the variable gain amplifier 96, and the amplifier 97 fluctuate according to the temperature or other environment conditions or when those levels or characteristics intrinsically have deviations, the level of the analog signal to be inputted to the modulator 94 is held at the appropriate input level, and the transmission wave at the "appropriate transmission level" is fed under the "transmitting power control" to the feeding point of the antenna 98.

According to the present embodiments, therefore, the desired performances can be more stably achieved than the above-described first and second embodiments.

Furthermore, in the present embodiments, the fluctuation of the level of the transmission wave is watched and suppressed via the feedback path leading to the controlling part 71 through the coupling circuit 72, the logarithmic amplification detection part 73, and the A/D converter 74.

However, the accuracy and responsiveness of the "transmitting power control" may also be enhanced, for example, by applying the following configuration to the present embodiments.

In the system leading to the output terminal of the amplifier 97 through the power controlling parts 91-1 to 91-N, the multiplexing part 92, the D/A converter 93, the modulator 94, the multiplier 95, and the variable gain amplifier 96, a (not-shown) thermally closely coupled temperature sensor is mounted at a portion where the changing rate of characteristics with respect to the temperature is the maximum.

The reference values of the gain to be set in the power controlling parts 91-1 to 91-N and the variable gain amplifier 96 in conformity with the operating temperature of the system are given in advance as a table or the like to the controlling part 71.

Among the reference values stored in advance in the table or the like, the reference value conforming to the temperature measured via the temperature sensor is applied by the controlling part 71.

In the following, the operations of the fourth embodiment according to the present invention will be described with reference to FIG. 10.

The difference between the present embodiment and the first to third embodiments described above is that the threshold value to be applied for the magnitude comparison with the above-described "maximum level" is set to the following value.

No matter whether the modulator 94 might be a passive modulator or an active modulator, the threshold value is so small as to allow the level of the modulation distortion, as illustrated in FIGS. 16(*a*) and (*b*), and the level of the analog signal for the maximum modulation accuracy is given to the modulator 94, so that the threshold value is given in advance as the gain to be set in the power controlling parts 91-1 to 91-N.

In other words, the modulator 94 is fed under the "transmitting power control" with the analog signal at the level for maximizing the SN ratio of the primary modulated wave, so that the transmission quality is stably kept higher than that of the first to third embodiments.

Figure 12:
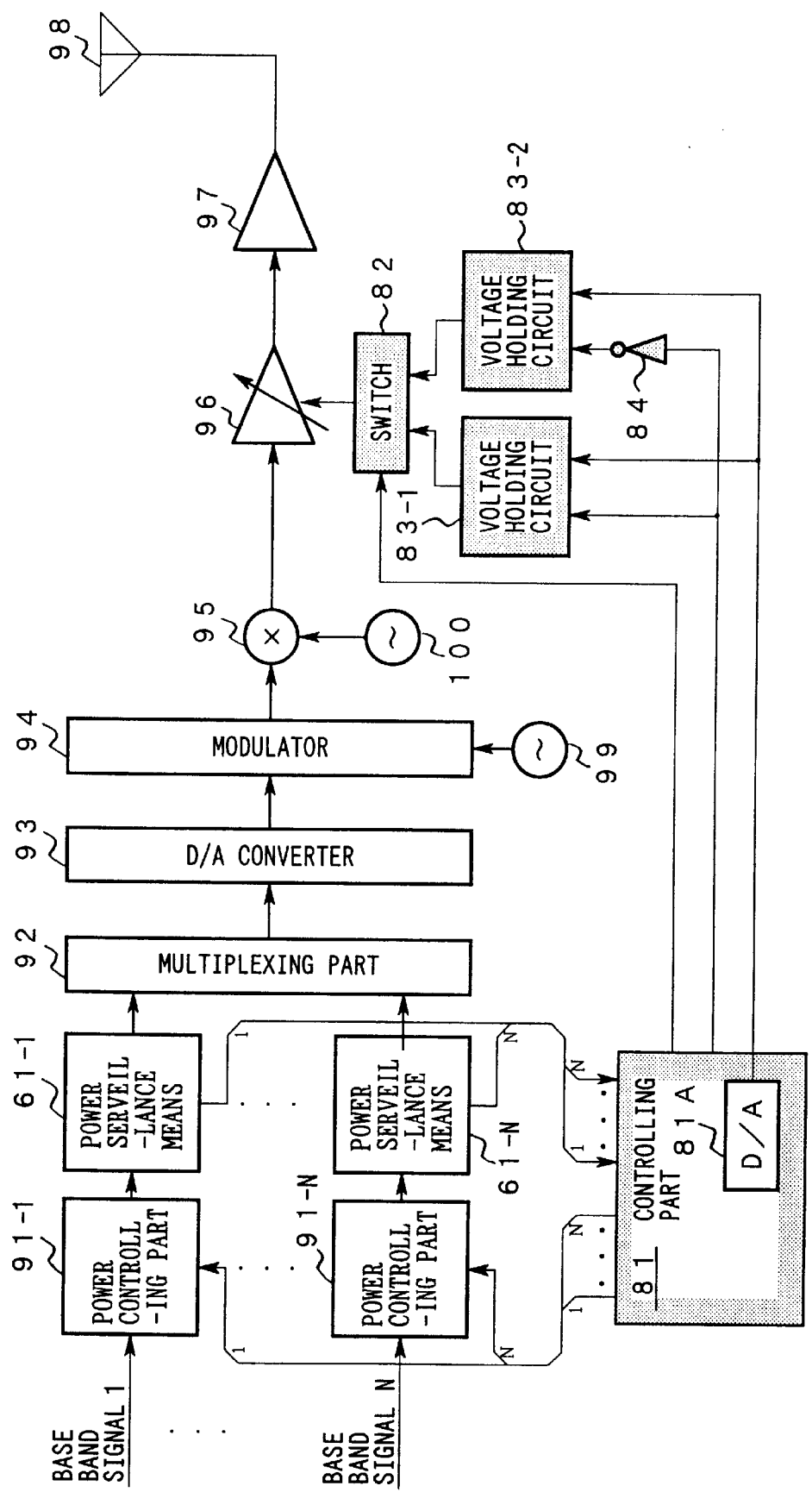
FIG. 12 is a block diagram showing the fifth embodiment according to the present invention.

FIG. 12 is a block diagram showing the fifth embodiment according to the present invention.

In FIG. 12, the components that have the same function and configuration are indicated by identical reference numerals as in FIG. 5 and description thereof will be omitted here.

The differences of the configurations between the present embodiment and the embodiment shown in FIG. 5 are that the components to be enumerated in the following are provided, and that their specific output port is directly connected with the control terminal of a voltage holding circuit 83-1.

A controlling part 81 in place of the controlling part 62;
A switch (SW) 82 having an output connected with the control terminal of the variable gain amplifier 96 and a control terminal connected with the corresponding output port of the controlling part 81;
Voltage holding circuits 83-1 and 83-2 having an analog input connected directly with the single analog port of the controlling part 81 individually and an output connected directly with the corresponding input of the switch 82; and
An inverter 84 arranged between the specific output port of the controlling part 81 and the control terminal of the voltage holding circuit 83-2.

Furthermore, the word length of any of the above-described output ports is 1 bit, and the controlling part 81 has a D/A converter (D/A) 81A arranged as the final stage of the above-described analog port.

Besides, the voltage holding circuits 83-1 and 83-2 have low-pass filters arranged at the front stage of the above-described analog input, and sample hold circuits individually arranged at the subsequent stages of those low-pass filters. Here, these low-pass filters and sample hold circuits are not shown.

Moreover, the corresponding relationship between the present embodiment and the block diagrams shown in FIGS. 1 to 4 are identical to those of the above-described first to fourth embodiments, but for that the voltage holding circuits 83-1 and 83-2 and the inverter 84 correspond to the holding means 27 and 48; that the switch 82 corresponds to the selecting means 28 and 49; and that the controlling part 81 corresponds to the controlling means 15, 25, 35 and 46.

Figure 13:
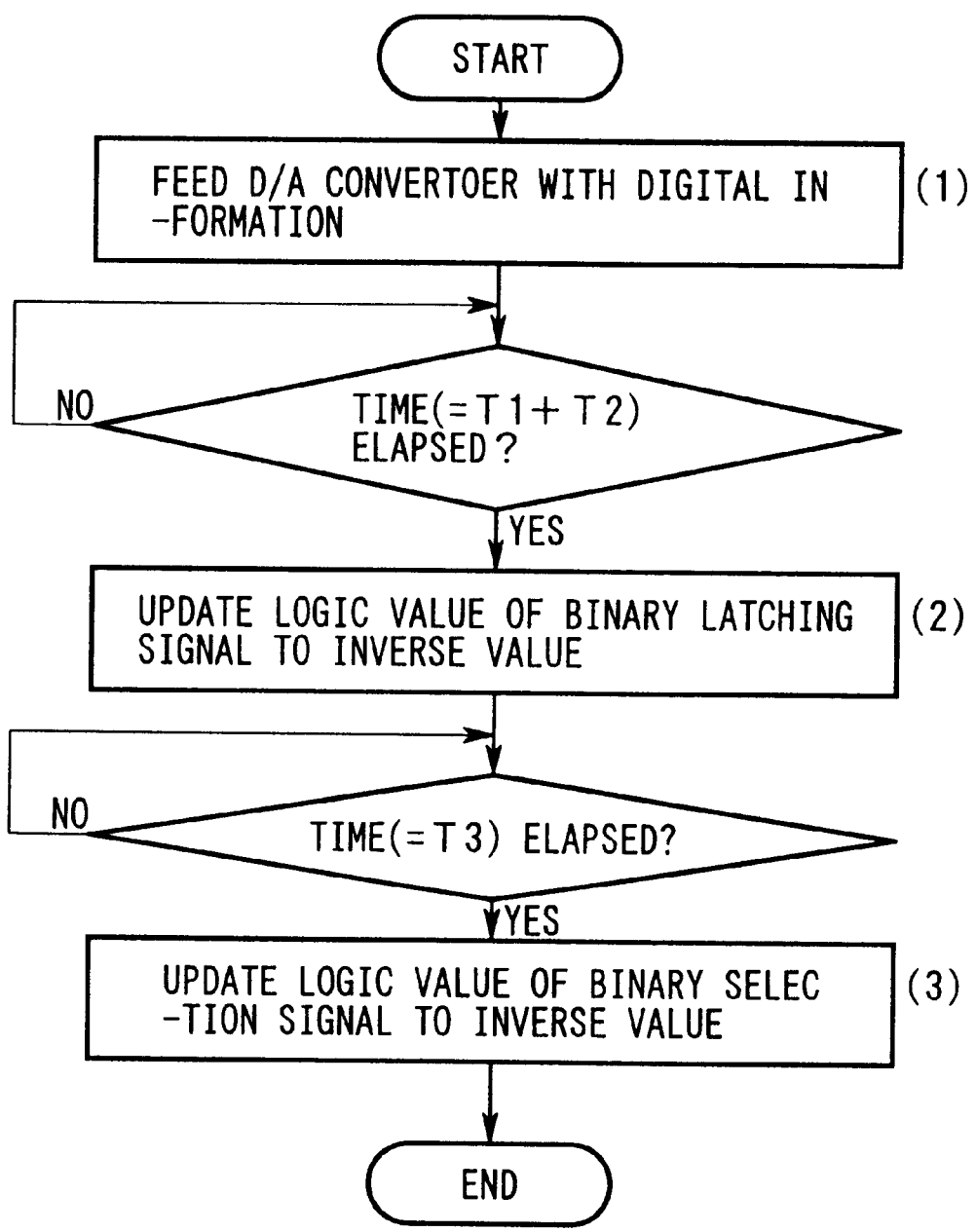
FIG. 13 is a flow chart of the operations of the fifth embodiment according to the present invention.

FIG. 13 is a flow chart of the operations of the fifth embodiment according to the present invention.

In the following, the operations of the present embodiment will be described with reference to FIGS. 12 and 13.

The present embodiment is characterized in that the controlling part 81 executes the following processes to set and update the gain of the variable gain amplifier 96.

The controlling part 81 feeds the D/A converter 81A with the digital information indicating the desired gain when the gain of the variable gain amplifier 96 is to be set or updated.

The D/A converter 81A generates an analog control signal indicating that digital information as an instantaneous value of voltage or current, and feeds the analog control signal to the voltage holding circuits 83-1 and 83-2.

The above-described low-pass filters individually belonging to the voltage holding circuits 83-1 and 83-2 suppress the noises of AC component, which are superimposed over the above-described analog control signal.

The controlling part 81 updates (FIG. 13(2)) the logic value of the binary latching signal, as set at or prior to the starting time, to an inverse value when there elapses the time period equal to or longer than the sum of a response time T1 of the D/A conversion executed by the D/A converter 81A and a time constant T2 intrinsic to the above-described low-pass filters.

The latching signal is fed directly to the voltage holding circuit 83-1 and a sample hold circuit built in the former.

Besides, it is through the inverter 84 that the latch signal is fed to the voltage holding circuit 83-2 and a sample hold circuit built in the former.

The sample hold circuits packaged in the voltage holding circuits 83-1 and 83-2 hold the instantaneous value of the analog control signal at the time point of rising of the latching signals fed individually thereto.

Moreover, the controlling part 81 updates (FIG. 13(3)) the logic value of the binary selection signals, as set at or prior to the starting time, to an inverse value after a standby over the time period T3 or longer, which is required for either of the sample hold circuits to hold a new instantaneous value of the analog control signal in response to the update of the logic value of the latching signals.

The switch 82 selects the newest value corresponding to the logic value of such selection signal, among the instantaneous values of the analog control signals held individually and given in parallel by the voltage holding circuits 83-1 and 83-2, and gives it to the control terminal of the variable gain amplifier 96.

Any of the analog control signal, latching signal, and selection signal is fed through a single signal line from the controlling part 81 to the voltage holding circuits 83-1 and 83-2 and the switch 82, and the analog control signal indicates a multiple-value as the above-described instantaneous value.

According to the present embodiment, therefore, the number of signal lines connecting the controlling part 81 with the voltage holding circuits 83-1 and 83-2 and the switch 82 is minimized.

Moreover, according to the present embodiment, since the number of signal lines to be used for the transmissions of the analog control signal, the latching signal, and the selection signal can be minimized, it is possible to ease the restrictions on the modularization of the controlling part 81 and other individual parts and on the mounting of the individual modules (or packages), and to lower the price, make the size small, accomplish the lightening, and improve the reliability.

Furthermore, in the present embodiment, the gain to be set in the variable gain amplifier 96 is given as the above-described instantaneous value of the analog control signal by the controlling part 81.

However, all or any of the above-described analog control signal, latching signal, and selection signal may be replaced by any digital signal or multiplexing signal, as long as the number of signal lines from the controlling part 81 to the variable gain amplifier 96 is reduced and as long as the desired performance is retained.

In the following, the operations of the sixth embodiment according to the present invention will be described with reference to FIG. 5.

The difference of the present embodiment from the above-described first and second embodiments is that the threshold value for the reference of the magnitude comparison with the above-described "maximum level" is updated in the following manner.

The controlling part 62 specifies the "maximum level" (FIG. 7(2)) as in the first and second embodiments.

As to the threshold value to be applied for the magnitude comparison with the maximum level, moreover, the controlling part 62 applies (FIG. 7(c)) a threshold value (hereinafter referred to as "first threshold value") similar to that applied to the above-described first and second embodiments, when the result of the prior magnitude comparison with the threshold value is false.

Likewise, when the result of the prior magnitude comparison is true, however, the controlling part 62 applies (FIG. 7(d)) a threshold value (hereinafter referred to as "second threshold value") which is smaller by a predetermined value e (>0) than the above-described first threshold value.

In other words, the magnitude comparison with the "maximum level" executed by the controlling part 62, is performed by applying the above-described "first threshold value" and "second threshold value" appropriately under the hysteresis depending on the history of the value at the "maximum level".

Therefore, even with the "maximum level" frequently fluctuating, the level of the analog signal to be inputted to the modulator 94 is stably held at the appropriate input level, and the transmission wave at the desired level appropriate for the "transmitting power control" is stably obtained.

Furthermore, in the each embodiment described above, the present invention is applied to the radio base station of the mobile communication system to which the CDMA system is applied.

However, the present invention can also be applied to a radio transmission part to which any of the multiple access system, the modulation system, the zone configuration, and the frequency allocation is applied.

Furthermore, when it is demanded to commonly amplify a plurality of AC signals distributing in a predetermined frequency band, the present invention can be applied to various systems or equipment no matter whether or not the AC signals are radio-frequency signals.

Besides, in the each embodiment described above, the distribution of the level diagram at each stage leading from the power controlling parts 91-1 to 91-N to the input terminal of the amplifier 97 is updated so that the analog signal at the level set on the basis of the "transmitting power control" and providing the desired characteristics of the modulator 94 may be fed to the modulator 94.

However, the present invention should not be limited to the transmission part provided with such modulator 94 but could be applied to the various systems or equipment when provided with such a circuit with which the desired characteristics can be obtained on the condition that the input signal is given the predetermined level as a demodulator or a frequency converter, for example.

Furthermore, when the dynamic range is short or a linearity is not retained for a specific circuit among the circuits arranged in series, for example, the distribution of the level diagram described above may be achieved in such a manner that the gains at the prior and subsequent stages of the specific circuit are set to the value for implementing the deficiency of the dynamic range or compensating the linearity.

Besides, in the each embodiment describe above, no configuration is disclosed on the passive modulator which can be applied as the modulator 94.

However, such a passive modulator may be configured with any circuit so long as the modulation processing is executed by a circuit composed of only a passive element, even if a thermo-sensitive device such as thermistor and diode or the like is applied for compensating the fluctuation in the characteristics with respect to the temperature.

Furthermore, in the each embodiment described above, the present invention is applied to the transmission part in which the levels of the base band signals corresponding to a plurality of different radio channels are set under the "transmitting power control" and in which those base band signals are multiplexed and transmitted.

However, the present invention should not be limited to such transmitting part but could likewise be applied to a circuit for modulations and demodulations relating to the single radio channel, such as the transmitting part or receiving part which is mounted on a mobile station equipment such as a mobile communication system.

Besides, in the each embodiment described above, the magnitude comparison with the "maximum level" is made with reference to either the single threshold value or the first threshold value replacing the former threshold value and the second threshold value, and the gain of the variable gain amplifier 96 is fitly updated to one of the two values corresponding to the comparison result.

As to the gain of the variable gain amplifier 96, however, such one of three or more gains as matches the result of the magnitude comparison between the "maximum level" and those threshold values may be applied when the threshold value is preset to two or more values appropriate for the characteristics of the modulator 94.

Furthermore, in the each embodiment described above, the level of the analog signal to be fed to the modulator 94 is set or updated by varying the gains of the power controlling parts 91-1 to 91-N in the base band region under the controls of the controlling parts 62, 71, and 81.

However, the level of such analog signal may be directly set or updated in the analog region.

Besides, in the each embodiment described above, the magnitude comparison of the "maximum level" is made with respect to the above-described threshold values (i.e., the first threshold value and the second threshold value).

However, the binary or multiple-value digital control or sample control for the magnitude comparison may be replaced by an analog control, so long as the level of the signal to be inputted to the circuit for retaining the desired characteristics is kept at an appropriate value as in the modulator 94.

In the each embodiment described above, moreover, the power controlling parts 91-1 to 91-N are arranged at the prior stages of the power surveillance parts 61-1 to 61-N, respectively.

However, the power controlling parts 91-1 to 91-N may be arranged solely or dispersedly at the stage subsequent to any of the power surveillance parts 61-1 to 61-N, the multiplexing part 92, and the D/A converter 93.

Besides, in the each embodiment described above, the level of the analog signal to be fed to the modulator 94 is kept at the "appropriate input level".

However, the level of the analog signal may be kept at a value approximating the "appropriate input level" in an accuracy to ease the fluctuation in the level of the base band signal measured by the power surveillance parts 61-1 to 61-N, so long as the fluctuation in the performance, as caused by the degradation in the characteristics of the modulator 94, is tolerable.

Moreover, the present invention is not be limited to the above-described embodiments and various modifications are possible within the scope of the invention, and any improvement may be made in part or all of the components.

What is claimed is:

1. A power control circuit comprising:

measuring means for measuring a level $Li$ of an input signal;

level variant means for amplifying said input signal with a first gain $G1$ and feeding the amplified input signal to a circuit for making a desired response when fed with a signal at a predetermined level $Ls$;

level adjustment means for amplifying an output signal obtained as a response of said circuit with a second gain $G2$; and controlling means for setting said first gain $G1$ to a ratio between said predetermined level $Ls$ and the level $Li$ measured by said measuring means and setting said second gain $G2$ to a ratio between a level $Lt$ of an output signal to be obtained at an output terminal of said level adjustment means and a product of said predetermined level $Ls$ and a gain $g$ of said circuit in a condition for making said desired response, wherein said controlling means sets said second gain $G2$ prior to said first gain $G1$ over a time period equal to a difference between a time period for which the gain of said level adjustment means reaches a stationary value in accordance with a change in said second gain $G2$ and a time period for which the gain of said level variant means reaches a stationary value in accordance with a change in said first gain $G1$.

2. A power control circuit comprising:

measuring means for measuring level $Li$ of a specific input signal to meet a requirement for a circuit making a desired response to make the desired response, among a plurality N of input signals fed in parallel, when fed with a signal at a predetermined level $Ls$, combining means for combining said plurality N of input signals to generate a single input signal;

level variant means for amplifying said single input signal which is generated by said combining means and is to be fed to said circuit, at a stage prior or subsequent to said combining means with a first gain $G1$;

level adjustment means for amplifying an output signal obtained as a response of said circuit with a second gain $G2$; and controlling means for setting said first gain $G1$ to a ratio between said predetermined level $Ls$ and the level $Li$ measured by said measuring means and setting said second gain $G2$ to a ratio between a level $Lt$ of an output signal to be obtained at an output terminal of said level adjustment means and a product of said predetermined level $Ls$ and a gain $g$ of said circuit in a condition for making said desired response, wherein said controlling means sets said second gain $G2$ prior to said first gain $G1$ over a time period equal to a difference between a time period for which the gain of said level adjustment means reaches a stationary value in accordance with a change in said second gain $G2$ and a time period for which the gain of said level variant means reaches a stationary value in accordance with a change in said first gain $G1$.

3. A power control circuit comprising:

measuring means for measuring a level $Li$ of an input signal;

level variant means for amplifying said input signal with a first gain $G1$ and feeding the amplified input signal to a circuit for making a desired response when fed with a signal at a predetermined level $Ls$;

level adjustment means for amplifying an output signal obtained as a response of said circuit with a second gain $G2$;

controlling means for setting said first gain $G1$ to a ratio between said predetermined level $Ls$ and the level $Li$ measured by said measuring means and setting said second gain $G2$ to a ratio between a level $Lt$ of an output signal to be obtained at an output terminal of said level adjustment means and a product of said predetermined level $Ls$ and a gain $g$ of said circuit in a condition for making said desired response; and output level watching means for measuring a level of the output signal obtained at the output terminal of said level adjustment means, wherein said controlling means sets said second gain $G2$ prior to said first gain $G1$ over a time period equal to a difference between a time period for which the gain of said level adjustment means reaches a stationary value in accordance with a change in said second gain $G2$ and a time period for which the gain of said level variant means reaches a stationary value in accordance with a change in said first gain $G1$, and wherein said controlling means is given in advance a desired value of the level of the output signal to be obtained at the output terminal of said level adjustment means and varies said second gain G2 to a value at which a deviation of the level measured by said output level watching means from said desired value is suppressed.

4. A power control circuit comprising:

measuring means for measuring a level Li of a specific input signal to meet a requirement for a circuit making a desired response to make the desired response, among a plurality N of input signals fed in parallel, when fed with a signal at a predetermined level Ls;

combining means for combining said plurality N of input signals to generate a single input signal;

level variant means for amplifying said single input signal which is generated by said combining means and is to be fed to said circuit, at a stage prior or subsequent to said combining means with a first gain G1;

level adjustment means for amplifying an output signal obtained as a response of said circuit with a second gain G2;

controlling means for setting said first gain G1 to a ratio between said predetermined level Ls and the level Li measured by said measuring means and setting said second gain G2 to a ratio between a level Lt of an output signal to be obtained at an output terminal of said level adjustment means and a product of said predetermined level Ls and a gain g of said circuit in a condition for making said desired response; and output level watching means for measuring a level of the output signal obtained at the output terminal of said level adjustment means, wherein said controlling means sets said second gain G2 prior to said first gain G1 over a time period equal to a difference between a time period for which the gain of said level adjustment means reaches a stationary value in accordance with a change in said second gain G2 and a time period for which the gain of said level variant means reaches a stationary value in accordance with a change in said first gain G1, and wherein said controlling means is given in advance a desired value of the level of the output signal to be obtained at the output terminal of said level adjustment means and varies said second gain G2 to a value at which a deviation of the level measured by said output level watching means from said desired value is suppressed.

5. A power control circuit comprising:

measuring means for measuring a level Li of an input signal;

level variant means for amplifying said input signal with a first gain G1 and feeding the amplified input signal to a circuit for making a desired response when fed with a signal at a predetermined level Ls;

level adjustment means for amplifying an output signal obtained as a response of said circuit with a second gain G2; and controlling means for setting said first gain G1 to a ratio between said predetermined level Ls and the level Li measured by said measuring means and setting said second gain G2 to a ratio between a level Lt of an output signal to be obtained at an output terminal of said level adjustment means and a product of said predetermined level Ls and a gain g of said circuit in a condition for making said desired response, wherein said controlling means feeds said level adjustment means with an analog control signal indicating said second gain G2 with an instantaneous value of voltage or current, and said level adjustment means includes holding means for holding the instantaneous values of a plurality of analog control signals fed by said controlling means, cyclically in an order of time series, and selecting means for applying a newest instantaneous value under control of said controlling means, among the instantaneous values of the plurality of analog control signals held by said holding means.

6. A transmitter comprising;

measuring means for measuring a level Li of an input signal;

level variant means for amplifying said input signal with a first gain G1;

a modulator for generating a modulated wave by modulating a carrier signal in accordance with the input signal fed through said level variant means, said modulator having a desired characteristic when fed with a signal at a predetermined level Ls;

level adjustment means for generating a transmission wave to be sent to a transmission channel by amplifying the modulated wave generated by said modulator with a second gain G2; and controlling means for setting said first gain G1 to a ratio between said predetermined level Ls and the level Li measured by said measuring means and setting said second gain G2 to a ratio between a level Lt of the transmission wave to be obtained at an output terminal of said level adjustment means and a product of said predetermined level Ls and a gain g of said modulator in a condition for making a desired response, wherein said controlling means sets said second gain G2 prior to said first gain G1 over a time period equal to a difference between a time period for which the gain of said level adjustment means reaches a stationary value in accordance with a change in said second gain G2 and a time period for which the gain of said level variant means reaches a stationary value in accordance with a change in said first gain G1.

7. A transmitter comprising:

combining means for combining a plurality of input signals fed in parallel and generating a single input signal;

a modulator for generating a modulated wave by modulating a carrier signal in accordance with the single input signal, said modulator having a desired characteristic when a level of said single input signal is at a predetermined level Ls;

level variant means for amplifying with a first gain G1 said single input signal to be fed to said modulator through said combining means, at a stage prior or subsequent to the combining means;

measuring means for measuring levels of said plurality of input signals;

level adjustment means for generating a transmission wave to be sent out to a transmission channel by amplifying the modulated wave generated by said modulator with a second gain G2; and controlling means for reducing the first gain G1 of said level valiant means and enlarging the second gain G2 of said level adjustment means, when the level of at least one input signal exceeds a threshold value in said measuring means, wherein said controlling means sets said second gain G2 prior to said first gain G1 over a time period equal to a difference between a time period for which the gain of said level adjustment means reaches a stationary value in accordance with a change in said second gain G2 and a time period for which the gain of said level variant means reaches a stationary value in accordance with a change in said first gain G1.

8. A transmitter comprising:

measuring means for measuring a level Li of an input signal;

level variant means for amplifying said input signal with a first gain input G1;

a modulator for generating a modulated wave by modulating a carrier signal in accordance with the input signal fed through said level variant means, said modulator having a desired characteristic when fed with a signal at a predetermined level Ls;

level adjustment means for generating a transmission wave to be sent to a transmission channel by amplifying the modulated wave generated by said modulator with a second gain G2;

controlling means for setting said first gain G1 to a ratio between said predetermined level Ls and the level Li measured by said measuring means and setting said second gain G2 to a ratio between a level Lt of the transmission wave to be obtained an output terminal of said level adjustment means and a product of said predetermined level Ls and a gain g of said modulator in a condition for making a desired response; and output level watching means for measuring a level of the transmission wave outputted by said level adjustment means, wherein said controlling means sets said second gain G2 prior to said first gain G1 over a time period equal to a difference between a time period for which the gain of said level adjustment means reaches a stationary value in accordance with a change in said second gain G2 and a time period for which the gain of said level variant means reaches a stationary value in accordance with a change in said first gain G1, and wherein said controlling means is given in advance a desired value of the level of the transmission wave to be outputted by said level adjustment means and varies said second gain G2 to a value at which a deviation of the level measured by said output level watching means from said desired value is suppressed.

9. A transmitter comprising:

combining means for combining a plurality of input signals fed in parallel and generating a single input signal;

a modulator for generating a modulated wave by modulating a carrier signal in accordance with the single input signal, said modulator having a desired characteristic when a level of said single input signal is at a predetermined level Ls;

level variant means for amplifying with a first gain G1 said single input signal to be fed to said modulator through said combining means, at a stage prior or subsequent to the combining means;

measuring means for measuring levels of said plurality of input signals;

level adjustment means for generating a transmission wave to be sent out to a transmission channel by amplifying the modulated wave generated by said modulator with a second gain G2;

controlling means for reducing the first gain G1 of said level variant means and enlarging the second gain G2 of said level adjustment means, when the level of at least one input signal exceeds a threshold value in said measuring means; and output level watching means for measuring a level of the transmission wave outputted by said level adjustment means, wherein said controlling means sets said second gain G2 prior to said first gain G1 over a time period equal to a difference between a time period for which the gain of said level adjustment means reaches a stationary value in accordance with a change in said second gain G2 and a time period for which the gain of said level variant means reaches a stationary value in accordance with a change in said first gain G1, and wherein said controlling means is given in advance a desired value of the level of the transmission wave to be outputted by said level adjustment means and varies said second gain G2 to a value at which a deviation of the level measured by said output level watching means from said desired value is suppressed.

10. A transmitter comprising;

measuring means for measuring a level Li of an input signal;

level variant means for amplifying said input signal with a first gain G1;

a modulator for generating a modulated wave by modulating a carrier signal in accordance with the input signal fed through said level variant means, said modulator having a desired characteristic when fed with a signal at a predetermined level Ls;

level adjustment means for generating a transmission wave to be sent to a transmission channel by amplifying the modulated wave generated by said modulator with a second gain G2; and controlling means for setting said first gain G1 to a ratio between said predetermined level Ls and the level Li measured by said measuring means and setting said second gain G2 to a ratio between a level Lt of a transmission wave to be obtained at an output terminal of said level adjustment means and a product of said predetermined level Ls and a gain g of said modulator in a condition for making a desired response, wherein said controlling means feeds said level adjustment means with an analog control signal indicating said second gain G2 with an instantaneous value of voltage or current, and wherein said level adjustment means includes holding means for holding the instantaneous values of a plurality of analog control signals fed by said controlling means, cyclically in an order of time series, and selecting means for applying a newest instantaneous value under control of said controlling means, among the values of the plurality of analog control signals held by said holding means.

* * * * *